(12) United States Patent
Ezuka

(10) Patent No.: US 6,744,315 B2
(45) Date of Patent: Jun. 1, 2004

(54) TRANSMISSION AMPLIFIER

(75) Inventor: Hiroyuki Ezuka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/345,024

(22) Filed: Jan. 15, 2003

(65) Prior Publication Data

US 2003/0231058 A1 Dec. 18, 2003

(30) Foreign Application Priority Data

Jun. 12, 2002 (JP) ........................................ 2002-170767

(51) Int. Cl.[7] .............................. H03F 1/26; H03F 1/30
(52) U.S. Cl. ...................................... 330/149; 330/151
(58) Field of Search ................................. 330/149, 151

(56) References Cited

U.S. PATENT DOCUMENTS 6,677,820 B2 * 1/2004 Miyatani .................... 330/149

FOREIGN PATENT DOCUMENTS

JP 362141806 * 6/1987

OTHER PUBLICATIONS

Jeon et al. "A new "active" predistortor with high gain using Cascode–FET Structures" IEEE 2002 RFIC Symposium, Jun. 2–4, 2002 pp 253–256.*

* cited by examiner

Primary Examiner—Michael B. Shingleton
(74) Attorney, Agent, or Firm—Katten Muchin Zavis Rosenman

(57) ABSTRACT

Disclosed is a transmission amplifier having a distortion compensator for compensating for distortion of an amplifier; an amplifier for amplifying the transmit signal that has undergone distortion compensation; a feedback unit for feeding an output signal from the amplifier back to the distortion compensator; and a delay circuit for inputting the transmit signal to the distortion compensator upon delaying the transmit signal for a delay time equivalent to time required for the feedback signal to arrive at the distortion compensator. A delay time $T_{DS}$ of the feedback signal at the time of stand-alone operation of the transmission amplifier and a delay time difference $\Delta T$ between delay times of the feedback signal at the time of stand-alone operation and at the time of parallel operation are stored in advance. The delay time $T_{DS}$ is set in the delay circuit at the time of stand-alone operation, and $(T_{DS}+\Delta T)$ is set in the delay circuit at the time of parallel operation.

8 Claims, 23 Drawing Sheets

FLOWCHART OF OPERATION AT START-UP

TRANSMISSION AMPLIFIER

BACKGROUND OF THE INVENTION

This invention relates to a transmission amplifier and, more particularly, to a transmission amplifier, which is equipped with a distortion compensating function, so adapted as to be capable of both stand-alone operation and parallel operation.

In wireless communications in recent years, there is growing use of high-efficiency transmission using digital techniques. In instances where multilevel amplitude modulation is applied to wireless communications, a vital technique is one which can suppress non-linear distortion by linearizing the amplification characteristic of the power amplifier on the transmitting side and reduce the leakage of power between adjacent channels. Also essential is a technique which compensates for the occurrence of distortion that arises when an attempt is made to improve power efficiency by using an amplifier that exhibits poor linearity.

FIG. 20 is a block diagram illustrating an example of a transmitting apparatus in a radio according to the prior art. Here a transmit-signal generator 1 transmits a serial digital data sequence and a serial/parallel (S/P) converter 2 splits the digital data sequence alternately one bit at a time to convert the data to two sequences, namely an in-phase component signal (also referred to as an "I signal") and a quadrature component signal (also referred to as a "Q signal"). A DA converter 3 converts the I and Q signals to respective analog baseband signals and inputs these to a quadrature modulator 4. The latter multiplies the input I and Q signals (the transmit baseband signals) by a reference carrier wave and a signal that has been phase-shifted relative to the reference carrier by 90· and sums the results of multiplication to thereby perform quadrature modulation and output the modulated signal. A frequency converter 5 mixes the quadrature-modulated signal and a local oscillation signal to thereby effect a frequency conversion, and a transmission power amplifier 6 power-amplifies the carrier output from the frequency converter 5. The amplified signal is released into space from an antenna 7.

In mobile communications based upon W-CDMA, etc., the transmission power of the transmitting apparatus is a high ten watts to several tens of watts, and the input/output characteristic [distortion function f(p)] of the transmission power amplifier 6 is non-linear, as indicated by the dotted line in (a) of FIG. 21. Non-linear distortion arises as a result of this non-linear characteristic, and the frequency spectrum in the vicinity of a transmission frequency $f_0$ develops side lobes, as shown in (b) of FIG. 21, leakage into the adjacent channel occurs and this causes interference between adjacent channels. More specifically, owing to non-linear distortion, there is an increase in power that causes transmitted waves to leak into the adjacent frequency channel, as shown at (b). ACPR (Adjacent Channel Power Ratio), which indicates the magnitude of leakage power, is the ratio between the power of the channel of interest, which is the area of the spectrum between the one-dot chain lines A and A' in FIG. 21(b), and the adjacent leakage power, which is the area of the spectrum between the two-dot chain lines B and B', that leaks into the adjacent channel. Such leakage power constitutes noise in other channels and degrades the quality of communication of these channels. Such leakage must be limited to the utmost degree.

Leakage power is small in the linear region [see (a) in FIG. 21] of the power amplifier and large in the non-linear region. Accordingly, it is necessary to broaden the linear region in order to obtain a transmission power amplifier having a high output. However, this necessitates an amplifier having a performance higher than that actually needed and therefore is inconvenient in terms of cost and apparatus size. Accordingly, a transmission apparatus that has come to be adopted is equipped with a distortion compensating function that compensates for distortion ascribable to non-linearity of the power amplifier.

FIG. 22 is a block diagram of a transmitting apparatus having a digital non-linear distortion compensating function that employs a DSP (Digital Signal Processor). Here digital data (a transmit signal) sent from the transmit-signal generator 1 is converted to the two sequences of I and Q signals by the S/P converter 2. These signals enter a distortion compensator 8 constituted by a DSP. The distortion compensator 8 includes a distortion compensation coefficient memory 8a for storing distortion compensation coefficients h(pi) (i=0~1023) conforming to power levels pi of a transmit signal x(t); a predistortion unit 8b for subjecting the transmit signal to distortion compensation processing (predistortion) using a distortion compensation coefficient h(pi) that is in conformity with the power level of the transmit signal; and a distortion compensation coefficient calculation unit 8c for comparing the transmit signal x(t) with a demodulated signal (feedback signal) y(t), which has been obtained by demodulation in a quadrature detector described later, and for calculating and updating the distortion compensation coefficient h(pi) in such a manner that the difference between the compared signals will approach zero.

The transmit signal that has been subjected to predistortion processing by the distortion compensator is input to the DA converter 3. The latter converts the input I and Q signals to analog baseband signals and applies the baseband signals to the quadrature modulator 4. The latter multiplies the input I and Q signals by a reference carrier wave and a signal that has been phase-shifted relative to the reference carrier by 90· and sums the results of multiplication to thereby perform quadrature modulation and output the modulated signal. The frequency converter 5 mixes the quadrature-modulated signal and a local oscillation signal to thereby effect a frequency conversion, and the transmission power amplifier 6 power-amplifies the carrier signal that is output from the frequency converter 5. The amplified signal is released into space from the antenna 7.

Part of the transmit signal is input to a frequency converter 10 via a directional coupler 9 so as to undergo a frequency conversion and then be input to a quadrature detector 11. The latter multiplies the input signal by a reference carrier wave and a signal that has been phase-shifted relative to the reference carrier by 90° to thereby perform quadrature detection, reproduces the I, Q signals of the baseband on the transmitting side and applies these signals to an AD converter 12. The latter converts the applied I and Q signals to digital data and inputs the digital data to the distortion compensator 8. By way of adaptive signal processing using the LMS (Least Mean Square) algorithm, the distortion compensator 8 compares the transmit signal before the distortion compensation thereof with the feedback signal demodulated by the quadrature detector 11 and proceeds to calculate and update the distortion compensation coefficient h(pi) in such a manner that the difference between the compared signals will become zero. By subsequently repeating this operation, non-linear distortion of the transmission power amplifier 6 is suppressed to reduce the leakage of power between adjacent channels.

FIG. 23 is a diagram useful in describing distortion compensation processing by an adaptive LMS. A multiplier 15a (which corresponds to the predistortion unit 8b in FIG. 22) multiplies the transmit signal x(t) by a distortion compensation coefficient $h_n(p)$. A DA converter 15b converts the distortion-compensated signal to an analog signal, which is applied to a power amplifier 15c having a distortion function f(p). A feedback loop 15d feeds back the output signal y(t) from the power amplifier and digital converter 15e converts the analog feedback signal to a digital signal. A power calculation unit 15f calculates the power p [$=x(t)^2$] of the transmit signal x(t) and outputs the power as a read-in address of a distortion compensation coefficient memory 15g. The memory 15g (which corresponds to the distortion compensation coefficient memory 8a of FIG. 22) stores the distortion compensation coefficients that conform to the power levels of the transmit signal x(t). The memory 15g outputs the distortion compensation coefficient $h_n(p)$ conforming to the power p of the transmit signal x(t) and updates the distortion compensation coefficient $h_n(p)$ by a distortion compensation coefficient $h_{n+1}(p)$ found by the LMS algorithm.

A distortion coefficient calculation unit 15h calculates the distortion compensation coefficient $h_{n+1}(p)$ found by the LMS algorithm. A delay circuit 15i is for generating a write address, a delay circuit 15j adjusts the timing at which the distortion coefficient $h_n(p)$ is output, and the delay circuit 15k adjusts the timings of the transmit signal x(t) and feedback signal y(t). The delay circuit 15k adds a delay time TD, which lasts from arrival of the transmit signal x(t) to input of the feedback signal y(t) to a multiplier 21, to the transmit signal X(t). A delay time decision unit 15m decides the delay time between the transmit signal x(t) and the feedback signal by a correlation operation. It should be noted that the transmit signal processor of FIG. 23 also includes a modulator/demodulator and a frequency converter, though these are not shown.

The distortion coefficient calculation unit 15h includes a subtractor 21 that outputs the difference e(t) between the transmit signal x(t) prior to distortion compensation and the feedback signal y(t); a multiplier 22 that performs multiplication between the error e(t) and a step-size parameter $\mu$; a complex-conjugate signal output unit 23 for outputting a complex-conjugate signal y*(t); a multiplier 24 for multiplying $h_n(p)$ by y*(t); a multiplier 25 for multiplying $\mu e(t)$ by u*(t); and an adder 26 for adding the distortion compensation coefficient $h_n(p)$ and $\mu e(t)u*(t)$. The arithmetic operations performed by the arrangement set forth above are as follows:

$$h_{n+1}(p)=h_n(p)+\mu e(t)u*(t)$$

$$e(t)=x(t)-y(t)$$

$$y(t)=h_n(p)x(t)f(p)$$

$$u(t)=x(t)f(p)=h_n(p)y*(t)$$

$$p=|x(t)|^2$$

where x, y, f, h, u, e represent complex numbers and signifies a complex conjugate. By executing the processing set forth above, the distortion compensation coefficient h(p) is updated so as to minimize the difference signal e(t) between the transmit signal x(t) and the feedback signal y(t), and the coefficient eventually converges to the optimum distortion compensation coefficient value so that compensation is made for the distortion in the transmission power amplifier.

The delay time decision unit 15m calculates correlation y(t) between the transmit signal x(t) prior to distortion compensation and the feedback signal, decides total delay time D ($=D_0+D_1$), which is produced by the power amplifier 15c and feedback loop 15d, etc., based upon the maximum correlation, and sets the delay in the delay circuits 15i, 15j, 15k. In the calculation of correlation, the delay time decision unit 15m shifts the delay time between the transmit signal x(t) and feedback signal y(t) successively a predetermined length of time, calculates the correlation between the transmit signal and feedback signal at each delay time and determines the delay time D ($=D_0+D_1$) for which correlation is maximized. In actuality, the determination of delay time is performed over a plurality of steps. For example, at a first step, as shown in FIG. 24, a search range is made a maximum delay time TA, and a time period $\Delta TA$ of the delay-time search is enlarged to find a rough delay-time range TB. Next, at a second step, the search range is made a delay-time range TB, and a time period $\Delta TB$ of the delay-time search is reduced ($\Delta TB<\Delta TA$) to find a delay-time range TC. Thereafter, and in similar fashion, the time period of the search is reduced to narrow down the delay-time search range. At a final step, a search range TD is made several hundred nanoseconds and the time period $\Delta TD$ of the delay-time search is made several tens of picoseconds (one sampling clock), whereby a highly precise delay time is decided. If this delay time cannot be set correctly, the distortion compensating function will not be performed effectively. The larger the delay-time setting error, the smaller the degree of distortion compensation, the larger the side lobes and the greater the leakage of power to the adjacent channel.

The components from the distortion compensator to the power amplifier shall be referred to as a transmission amplifier. The transmission power of this transmission power amplifier presently is limited to 40 to 50 W. If power is less than 40 to 50 W, the transmission power amplifier operates in stand-alone fashion; if power is greater than 40 to 50 W, e.g., 80 W, the transmission power amplifier operates in parallel fashion. The transmission amplifier therefore is so adapted as to be capable of stand-alone operation, in which the amplifier output signal emanates from the antenna as is, and parallel operation, in which the output signals of two amplifiers are combined before being released from the antenna. The stand-alone operation often is used in a transmission diversity operation, and the parallel operation often is used in a non-diversity operation.

FIG. 25 is a diagram showing a transmission amplifier in a stand-along configuration, and FIG. 26 is a diagram showing transmission amplifiers in a parallel-operation configuration. A transmission amplifier 30 comprises a transmit-signal processor 31 and an amplifier 32 and is housed within a case 33. The transmit-signal processor 31 has a distortion compensator, a DA/AD converter, a quadrature modulator/demodulator and a frequency converter (up-converter/down-converter), etc., though these are not shown. The case 33 is provided with a first terminal T1 to which the transmit signal x(t) is input, a second terminal T2 for sending the signal that is output from the transmit-signal processor 31, a third terminal T3 to which the signal input to the amplifier 32 is applied, a fourth terminal T4 from which the output signal of the amplifier 32 is sent, and a fifth terminal T5 to which a feedback signal is input.

At the time of stand-alone operation, the second and third terminals are directly connected and the fourth and fifth terminals are directly connected, as shown in FIG. 25. At the time of parallel operation, on the other hand, as shown in FIG. 26, second terminals T2, T2 of transmission amplifiers 30A, 30B are connected to two input terminals of a hybrid HYB (distributor/combiner) 33, the output terminal of the hybrid HYB 33 is connected to the input terminal of a hybrid HYB 34, and two output terminals of the hybrid HYB 34 are connected to third terminals T3, T3 of transmission amplifiers 30A, 30B. Further, two input terminals of a hybrid HYB 35 are connected to amplifier output terminals T4, T4 of the transmission amplifiers 30A, 30B, and the output terminal of the hybrid HYB 35 is connected to fifth terminals T5, T5 of the transmission amplifiers 30A, 30B. At the time of parallel operation, the transmit-signal processor 31 of only one of the transmission amplifiers 30A, 30B is operated and the operation of the other transmit-signal processor is halted. If the transmit-signal processor 31 of the transmission amplifier 30A is operated, for example, the signal output from the transmit-signal processor 31 is input to the hybrid 34 via the hybrid 33, and the hybrid 34 branches the signal to the amplifiers 32, 32 of the transmission amplifiers 30A, 30B. The transmit signals that have been amplified by the amplifiers 32 of the transmission amplifiers 30A, 30B are input to the hybrid HYB 35, where the signals are combined and released from the antenna and fed back to the fifth terminal T5 of the transmission amplifier 30A.

Whether operation is stand-alone or parallel depends upon whether hybrids (distributor/combiner) are installed on the shelf that accommodates the transmission amplifiers. At the time of manufacture, therefore, it is not known which mode of operation will be adopted for the transmission amplifiers. Owing to this system of operation, the following problems arise when the transmission amplifier is started up:

When each transmission amplifier is manufactured, the delay time of the feedback signal that prevails at the time of stand-alone operation is measured and then recorded internally. If stand-alone operation is adopted in the field, then the recorded delay time is read out and set in the delay circuits 15$i$, 15$j$, 15$k$ (see FIG. 23), thereby making high-speed start-up possible. If parallel operation is adopted, however, the delay time will differ from that of stand-alone operation and a delay adjustment (measurement of delay time and setting thereof) must be made again starting from the first step of FIG. 24. Furthermore, measuring and recording delay time of the feedback signal, which will prevail at the time of parallel operation, when the amplifier is manufactured is difficult from the standpoints of improving ease of manufacture and avoiding an increase in factory equipment.

Another problem is that if the adjustment of feedback-signal delay is performed from the first step, several minutes to ten-odd minutes will be required and it will take considerable time before the radio waves can be emitted.

A further problem is that when transmission power varies between delay adjustments, the accuracy of the delay adjustment declines. Since delay adjustment time is a long several minutes to ten-odd minutes, a change in transmission power occurs frequently.

Yet another problem is that since distortion compensation is not carried out between delay adjustments, unnecessary waves (distortion) are transmitted when output power is above a certain value.

SUMMARY OF THE INVENTION

Accordingly, an object of the present invention is to make possible high-speed start up equivalent to that at the time of stand-alone operation even at the time of parallel operation.

Another object of the present invention is to make high-speed start-up possible by deciding delay time in a short time (several seconds or less) even in a case where a delay adjustment is necessary in order to accommodate for a variance in amount of delay in a passive circuit such as a hybrid mounted externally of a transmission amplifier.

A further object of the present invention is to prevent a decline in delay-time decision accuracy even in a case where transmission power before and transmission power after determination of delay time differs by more than a fixed value.

Another object of the present invention is to contribute to maintenance of communication stability and quality of radio waves by preventing the transmission of unnecessary waves when delay time is decided.

A further object of the present invention is to return to a normal state of communication rapidly after a delay-time decision while suppressing transmission of unnecessary waves.

According to the present invention, the foregoing objects are attained by providing a transmission amplifier having a distortion compensator for compensating for distortion of an amplifier by updating distortion compensation coefficients so as to null a difference between a transmit signal and a feedback signal, and subjecting the transmit signal to distortion compensation processing using the distortion compensation coefficients; an amplifier for amplifying the transmit signal that has undergone distortion compensation; a feedback unit for feeding an output signal from the amplifier back to an arithmetic unit that; calculates the difference in the distortion compensator; and a delay circuit for inputting the transmit signal to the arithmetic unit upon delaying the transmit signal for a delay time equivalent to time required for the feedback signal to arrive at the arithmetic unit. In order to set an accurate delay time in the delay circuit at the time of stand-alone operation and parallel operation, the transmission amplifier of the present invention includes a storing unit for storing, in advance, a delay time $T_{DS}$ of the feedback signal at the time of stand-alone operation and a delay time difference $\Delta T$ [or the sum $(T_{DS}+\Delta T)$] between delay times of the feedback signal at the time of stand-alone operation and at the time of parallel operation; and a delay-time setting unit for setting the delay time $T_{DS}$ in the delay circuit at the time of stand-alone operation and setting $(T_{DS}+\Delta T)$ in the delay circuit at the time of parallel operation. By thus providing the transmission amplifier with the storing unit and delay-time setting unit, high-speed start-up similar to that at the time of stand-alone operation becomes possible.

Further, by providing a delay-time decision unit for deciding an accurate delay time by adopting a narrow range in the vicinity of the set delay time as the object of a search, it is possible to achieve high-speed start-up by deciding delay time in a short time (several seconds or less) even in a case where a delay adjustment is necessary.

Further, by providing a power measurement unit for measuring transmit-signal power and a controller for performing control so as to decide delay time again when transmission power before and transmission power after a delay-time decision differs by more than a fixed value, a decline in the precision of the delay-time decision can be prevented.

Further, by providing a gain varying unit for controlling gain of the transmit signal and a controller for controlling the gain varying unit, when delay time is decided, to lower the gain of the transmit signal and then restore the original gain of the transmit signal after delay time is decided, the transmission of unnecessary waves when delay time is decided is prevented, thereby making it possible to contribute to maintenance of communication stability and quality of radio waves. In this case, by gradually restoring the lowered gain to the original gain following the delay-time decision, distortion compensation can be performed stably and a normal state of communication can be restored rapidly while transmission of unnecessary waves is suppressed.

Other features and advantages of the present invention will be apparent from the following description taken in conjunction with the accompanying drawings.

BRIEF DESCRIPTION OF THE DRAWINGS

DESCRIPTION OF THE PREFERRED EMBODIMENTS (A) Implementation of Stand-Alone Operation and Implementation of Parallel Operation

Figure 1:
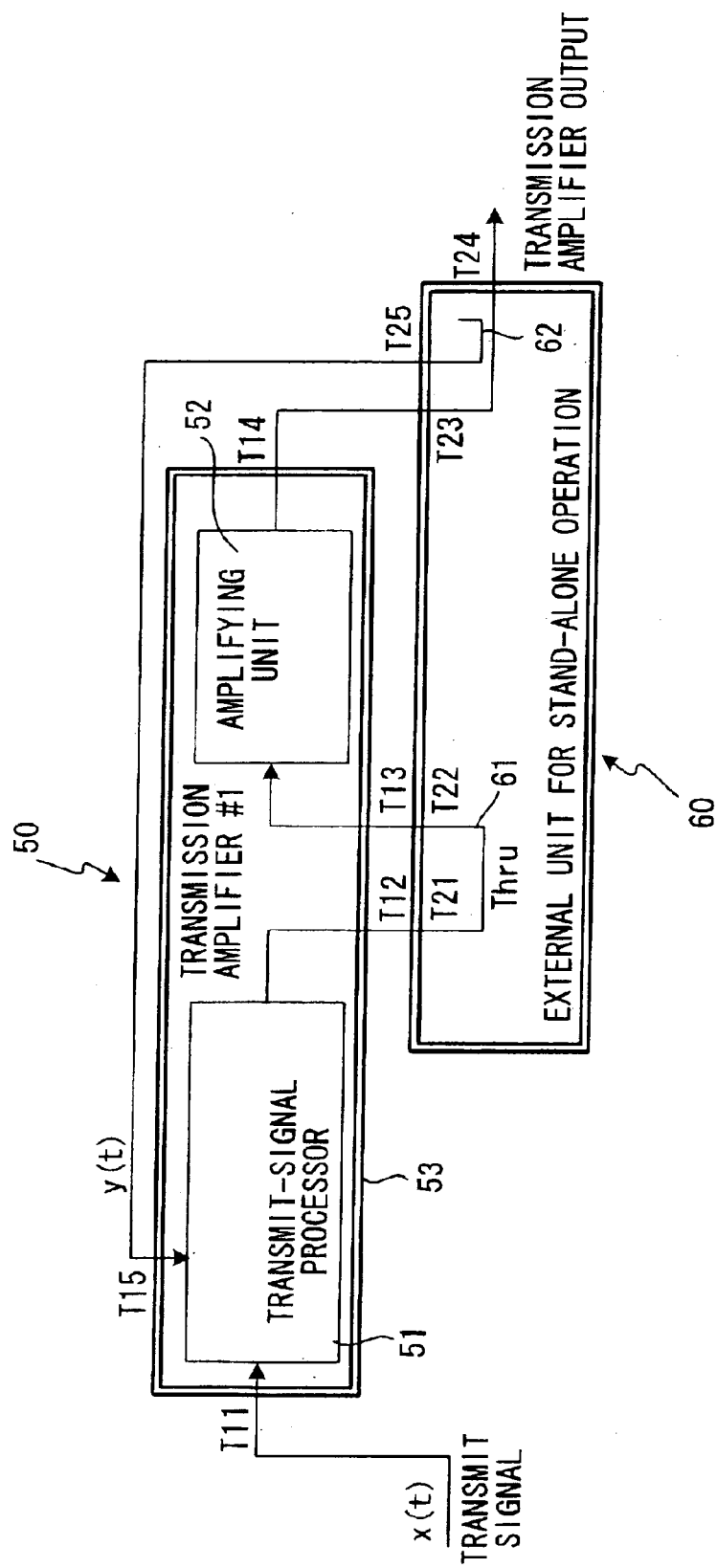
FIG. 1 is a diagram showing implementation of stand-alone operation of a transmission amplifier according to the present invention.

A transmission amplifier 50 comprises a transmit-signal processor 51 and an amplifying unit 52 and is housed within a case 53. The transmit-signal processor 50 has a distortion compensator, a DA/AD converter, a quadrature modulator/demodulator and a frequency converter (up-converter/down-converter), etc. The case 53 is provided with a first terminal T11 to which the transmit signal x(t) is input, a second terminal T12 for transmitting the signal that is output from the transmit-signal processor 51, a third terminal T13 for loading the signal input to the amplifying unit 52, a fourth terminal T14 from which the output signal of the amplifying unit 52 is transmitted, and a fifth terminal T15 to which a feedback signal y(t) is input.

At the time of stand-alone operation, use is made of a unit 60, which is provided externally of the transmission amplifier, for the stand-alone operation. The external unit 60 has terminals T21, T22 for directly connecting the second and third terminals T12, T13 of the transmission amplifier 50 by a short circuit 61; a terminal T23 to which the output of the transmission amplifier 50 is input; a terminal T24 for inputting the output of the transmission amplifier to an antenna; and a terminal T25 for inputting part of the output signal of the transmission amplifier 50, which has been detected by a directional coupler 62, to the fifth terminal T15 of the transmission amplifier as the feedback signal y(t).

When the stand-alone operation is to be performed, the transmission amplifier 50 and external unit 60 are connected as shown in FIG. 1 to obtain the stand-alone operation configuration.

Figure 2:
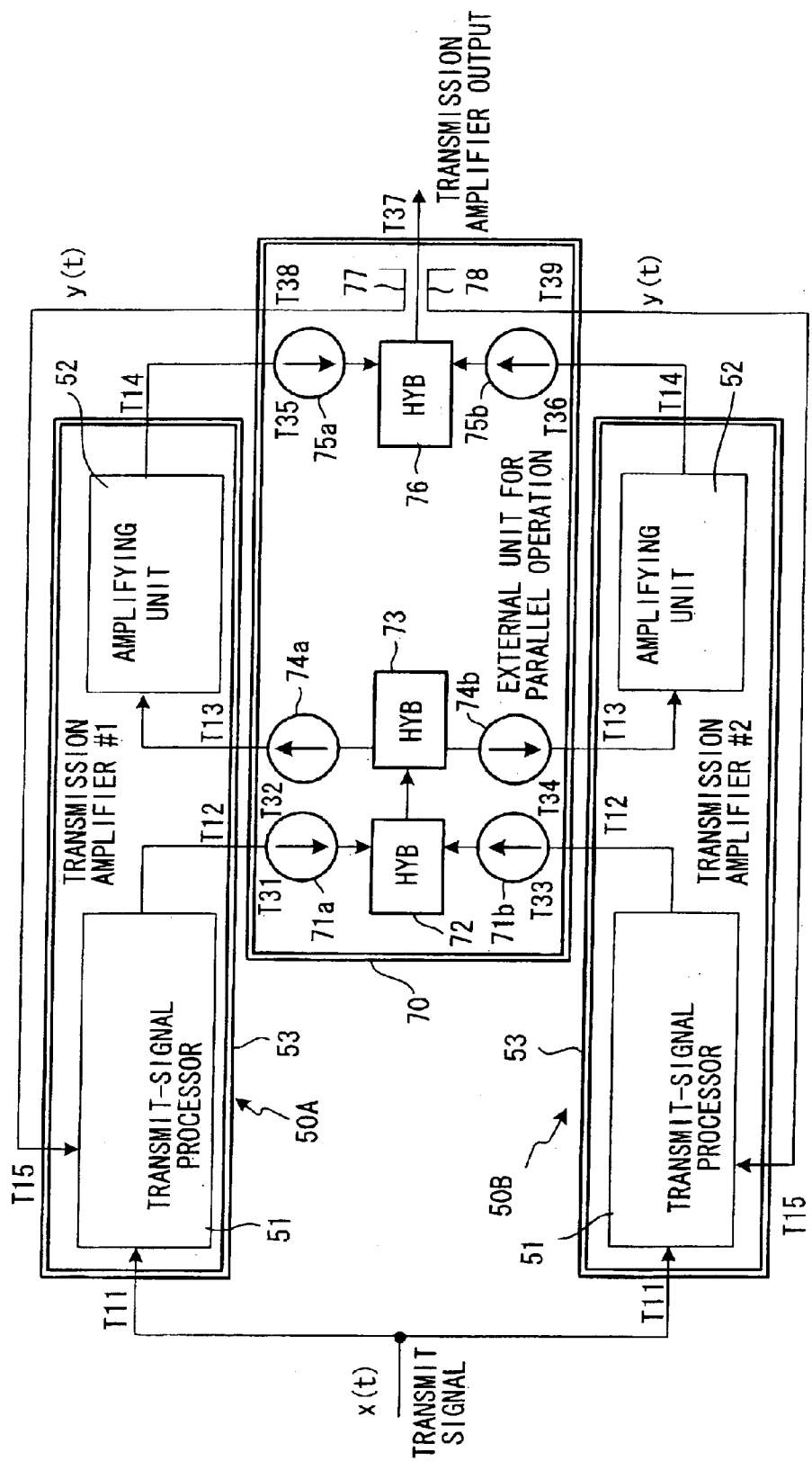
FIG. 2 is a diagram showing implementation of parallel operation of a transmission amplifier according to the present invention.

At the time of parallel operation, use is made of a unit 70, which is provided externally of the transmission amplifier, for the parallel operation, as shown in FIG. 2. The external unit 70 has terminals T31 to T34 for connecting the second and third terminals T12, T13 of transmission amplifiers 50A, 50B via isolators and hybrids HYB; terminals T35, T36 to which output signals of the transmission amplifiers 50A, 50B are input; a terminal T37 for combining and outputting the output signals of the transmission amplifiers 50A, 50B; and terminals T38, T39 for inputting parts of the output signals of the transmission amplifiers to the fifth terminals T15 of the transmission amplifiers 50A, 50B as the feedback signal y(t).

In the external unit 70 for parallel operation, signals that enter from the transmit-signal processors 51, 51 of the transmission amplifiers 50A, 50B are combined by a hybrid 72 via isolators 71a, 71b, separated by a hybrid 73 and input to the amplifying units 52 of the transmission amplifiers 50A, 50B. The output signals of the amplifying units 52 of the transmission amplifiers 50A, 50B are combined by a hybrid 76 via isolators 75a, 75b and input to the antenna from the terminal T37. Partial output signals of the combined signal of the amplifier detected by directional couplers 77, 78 are input to the fifth terminals T15 of the transmission amplifiers 50A, 50B as the feedback signals y(t). Isolators are inserted in order to prevent impedance mismatch. If one of the two systems fails, impedance fluctuates and the amplifier output of the normal system pulsates. If isolators are inserted, impedance mismatch is prevented and the amplifier output can be prevented from pulsating.

At the time of parallel operation, the transmit-signal processor 51 of only one of the transmission amplifiers 50A, 50B is operated and the operation of the other transmit-signal processor is halted. If the transmit-signal processor 51 of the transmission amplifier 50A is operated, for example, the signal that is output from the transmit-signal processor 51 is input to the hybrid 73 via isolator 71a and hybrid 72, and the hybrid 72 branches the signal to the amplifying units 52, 52 of the transmission amplifiers 50A, 50B. The transmit signals that have been amplified by the amplifying units 52, 52 of the transmission amplifiers 50A, 50B are input to the hybrid HYB 76, where the signals are combined and released from the antenna and fed back to the fifth terminals T15 of the transmission amplifiers 50A, 50B.

A difference $\Delta T$ develops between delay time of the stand-alone operation and delay time of the parallel operation owing to a difference in line length and whether or not isolators and hybrids are present in the paths. The difference $\Delta T$ in delay time is recorded within the transmission amplifier 50 beforehand. Further, when the transmission amplifier 50 is manufactured, delay time $T_{DS}$ at the time of stand-alone operation is measured and recorded. When parallel operation is carried out, these delay times are summed and set in the delay circuit, after which the apparatus is started up. Even at the time of parallel operation, therefore, a delay adjustment is not necessary and high-speed start-up equivalent to that at the time of stand-alone operation can be achieved.

Examples of Methods of Acquiring the Difference $\Delta T$ Between the Delay Times are as Follows:

(1) When the system is designed or a prototype manufactured, the delay times in the stand-alone and parallel operations are measured and the difference between them is adopted as the delay-time difference $\Delta T$.

(2) The delay-time difference $\Delta T$ is calculated from the delay time of one isolator, the delay time of one hybrid and the numbers of these isolators and hybrids.

(B) High-Speed Delay-time Delay Adjustment

The delay time $(\Delta T+T_{DS})$ at the time of parallel operation is not the precise time delay of the feedback signal. This makes necessary a delay adjustment for precisely measuring delay time and setting the same.

In order to decide delay time, the usual practice is as follows, by way of example: At a first step, the delay time is found by changing the time lag between the transmit signal and feedback signal successively at N-number of sampling time units. Thereafter, at a second step, the correlation between the feedback signal and a transmit signal in the vicinity of the delay discrepancy of greatest correlation obtained at the first step is found while changing the delay discrepancy successively at the sampling time unit, and the delay time is decided based upon the time lag for which the greatest correlation is obtained. With this method, however, deciding the delay time takes several minutes to ten-odd minutes.

Accordingly, in the present invention, the delay-time decision unit regards the delay time $(\Delta T+T_{DS})$ of parallel operation as a delay discrepancy of greatest correlation obtained at the first step and, rather than rendering the delay-time decision at N-number of sampling time units of the first step, renders the delay-time decision at the sampling time unit of the second step. As a result, delay time can be decided at high speed. It should be noted that since this high-speed delay adjustment accommodates for disparities in delay time from one component to another, the adjustment can be carried out irrespective of whether operation is stand-alone operation or parallel operation.

(C) Transmit-signal Processor of First Embodiment

Figure 3:
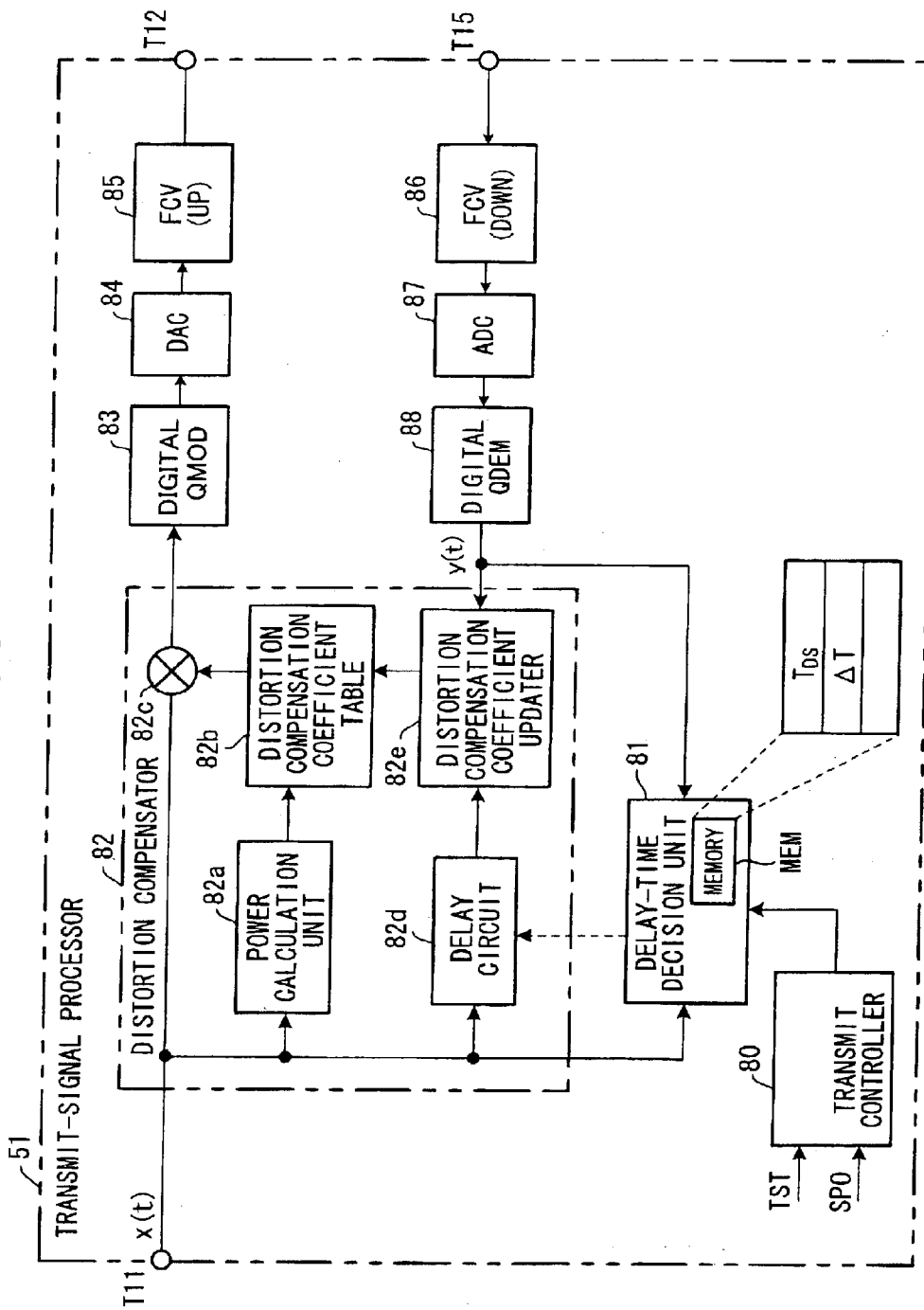
FIG. 3 is a block diagram showing a transmit-signal processor in a transmission amplifier according to a first embodiment of the present invention.

FIG. 3 is a block diagram showing the transmit-signal processor 51 in the transmission amplifier of the first embodiment.

The transmit-signal processor 51 includes a transmit controller 80. In accordance with an operation-type signal SPO indicative of either stand-alone operation or parallel operation and a transmit-start signal TST supplied by a host apparatus, the transmit controller 80 instructs a delay-time decision unit 81 to set a delay time that conforms to the type of operation. A delay-time decision unit 81 has already stored, in a memory MEM, the delay time $T_{DS}$ of the feedback signal prevailing at the time of stand-alone operation and the delay-time difference $\Delta T$ between the delay times of the feedback signals at the time of stand-alone operation and parallel operation. Accordingly, when the aforementioned command is received from the controller 80, the delay-time decision unit 81 sets the delay time $T_{DS}$ in a delay circuit 82d of a distortion compensator 82 at the time of stand-alone operation, and calculates $(T_{DS}+\Delta T)$ and sets this in the delay circuit 82d at the time of parallel operation.

The distortion compensator 82 has a power calculation unit 82a for calculating the power of the transmit signal x(t) that enters from the terminal T11, reads a distortion compensation coefficient h(pi) conforming to power pi (i=0 to 1023) out of a distortion compensation coefficient table 82b, and inputs the coefficient to a predistortion unit 82c. The latter subjects the transmit signal x(t) to distortion compensation processing (predistortion) using the distortion compensation coefficient h(p) conforming to the power level of the transmit signal, and outputs the resulting signal.

The signal (actually a complex signal) that has been subjected to distortion compensation processing by the distortion compensator 82 is input to a digital modulator (QMOD) 83. The latter applies quadrature modulation to the in-phase and quadrature components (I and Q signals) of the signal that, has undergone distortion compensation processing, and a DA converter 84 converts the digital quadrature-modulated signal to an analog signal and inputs the analog signal to a frequency converter (FCV) 85. The latter mixes the quadrature-modulated signal and a local oscillation signal, thereby up-converting the modulated-signal frequency to radio frequency. The radio-frequency signal is output from the terminal T12.

The output signal of the amplifying unit 52 (FIG. 1 or 2) is fed back and input to a frequency converter 86 from the terminal T15. The frequency converter (FCV) 86 down-converts the radio-frequency signal to a prescribed frequency signal and inputs this signal to an AD converter 87. The latter converts the baseband signals to digital data and inputs the digital data to a quadrature demodulator (QDEM) 88. The latter subjects the input signal to quadrature demodulation processing, reproduces the baseband signals on the transmitting side and inputs the result as the feedback signal y(t) to an error calculation unit (not shown) within a distortion compensation coefficient updater 82e. The latter compares the transmit signal x(t), which has been delayed by the delay circuit 82d, with the demodulated signal (feedback signal) y(t) obtained by demodulation in the quadrature demodulator (QDEM) 88, calculates distortion compensation coefficients h(pi) based upon an adaptive control algorithm so as to null the difference between the compared signals, and updates old coefficients in the distortion compensation coefficient table 82b by the calculated distortion compensation coefficients. By subsequently repeating the above operation, non-linear distortion of the amplifying unit 52 in the transmission amplifier is suppressed to reduce leakage of power between adjacent channels.

In accordance with the above embodiment, delay time $T_{DS}$ of the feedback signal at the time of stand-alone operation and the difference $\Delta T$ between the delay time of the feedback signal at the time of stand-alone operation and the delay time of the feedback signal at the time of parallel operation are stored beforehand. As a result, the delay time $T_{DS}$ can be stored in the delay circuit 82d at the time of stand-alone operation, and ($T_{DS}+\Delta T$) can be stored in the delay circuit 82d at the time of parallel operation. This makes it possible to achieve high-speed start-up both when stand-alone operation is started up and when parallel operation is started up. In this embodiment, the difference $\Delta T$ between the delay time of the feedback signal at the time of stand-alone operation and that of the feedback signal at the time of parallel operation is stored. However, ($T_{DS}+\Delta T$) can also be stored.

The foregoing is for a case where distortion compensation is made without adjusting the delay time set in the delay circuit 82d. With regard to calculation of $\Delta T$, however, as mentioned earlier, (1) the delay times in the stand-alone and parallel operations are measured and the delay-time difference $\Delta T$ is calculated from the difference between these delay times when the system is designed or a prototype manufactured, or (2) the delay-time difference $\Delta T$ is calculated using the delay time per isolator and hybrid mounted externally of the transmission amplifier and the numbers of these isolators and hybrids employed. Further, the passive circuits such as the isolators and hybrids exhibit different amounts of delay from one to another. As a consequence, $\Delta T$ is only an approximate value and is not an accurate delay-time difference. Accordingly, it is desired that accurate delay time at the time of parallel operation be decided and set in the delay circuit 82d (high-speed delay adjustment).

Figure 4:
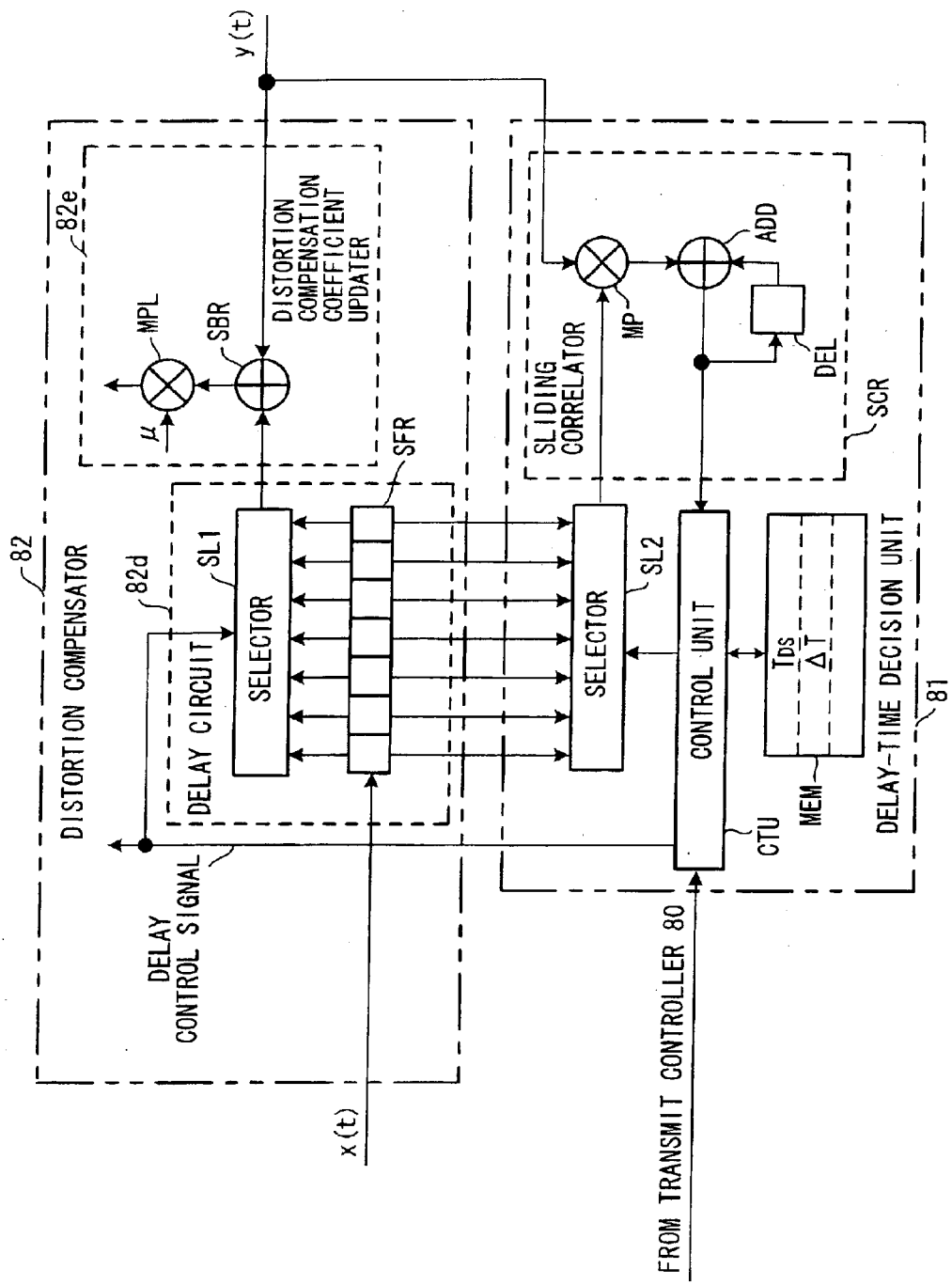
FIG. 4 is a block diagram illustrating a delay-time decision unit, which employs a sliding correlator, and components peripheral thereto.

FIG. 4 is a block diagram illustrating the delay-time decision unit 81, which employs a sliding correlator, and components peripheral thereto. Components identical with those shown in FIG. 3 are designated by like reference characters. The delay circuit 82d has a shift register SFR for storing the digital transmit signal x(t), which arrives at the sampling cycle, while shifting the signal successively, and a selector SL1 for extracting the transmit signal from a prescribed shift position of the shift register SFR and inputting the signal to a subtractor SBR of the distortion compensation coefficient updater 82e. The shift length of the shift register SFR is determined so as to be greater than a maximum delay time. The transmit signal at an mth shift position from the leading position is delayed by m·Ts (where Ts represents the sampling cycle). The distortion compensation coefficient updater 82e has a multiplier MPL for multiplying the output signal of the subtractor SBR by a step-size parameter $\mu$.

The delay-time decision unit 81 has a sliding correlator SCR, a control unit CTU, a selector SL2 and a memory MEM. The delay time $T_{DS}$ of the feedback signal prevailing at the time of stand-alone operation and the delay-time difference $\Delta T$ between the delay signals at the time of stand-alone operation and at the time of parallel operation have been stored in the memory MEM. The sliding correlator SCR calculates the correlation between the transmit signal x(t), which has been delayed by the prescribed delay time, and the feedback signal y(t) by performing multiplication between these sample by sample and summing the results of multiplication. The sliding correlator SCR includes a multiplier MP, a delay unit DEL and an adder ADD for adding the summed value calculated thus far and the present result of multiplication. The selector SL2 controls the time lag (delay time) of the transmit signal x(t) relative to the feedback signal y(t) by changing over the shift position of the shift register SFR that extracts the transmit signal x(t). The control unit CTU finds the delay time for which the correlation is maximized and sets this delay time in the selector SL1 of the delay circuit 82d.

Figure 5:
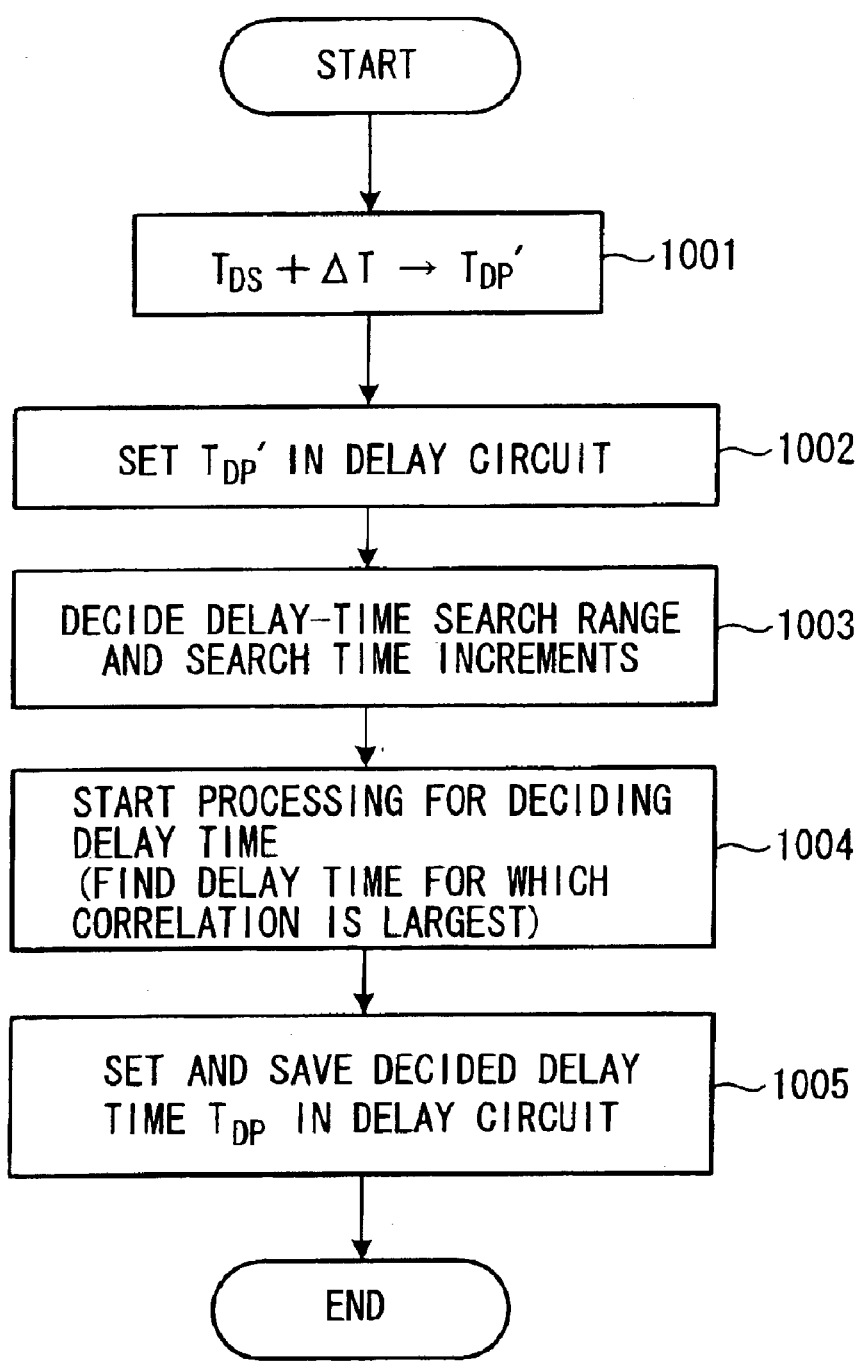
FIG. 5 is a flowchart illustrating processing of control for high-speed delay adjustment at the time of parallel operation.

FIG. 5 is a flowchart illustrating processing of control for high-speed delay adjustment at the time of parallel operation.

When the host apparatus issues the operation-type signal SPO indicative of parallel operation and the transmit-start signal TST, the transmit controller 80 instructs the delay-time decision unit 81 to set a delay time that conforms to the parallel operation.

When the transmit controller 80 instructs the setting of the delay time conforming to parallel operation, the control unit CTU of the delay-time decision unit 81 reads the delay time $T_{DS}$ of the feedback signal prevailing at the time of stand-alone operation and the delay-time difference $\Delta T$ between the feedback signals at the time of stand-alone operation and at the time of parallel operation out of the memory MEM, calculates a delay time $T_{DP}'$ ($=T_{DS}+\Delta T$) of the feedback signal prevailing at the time of parallel operation (step 1001) and sets this delay time in the selector SL1 of the delay circuit 82d (step 1002). The selector SL1 reads the transmit signal from the shift position of the shift register SFR that conforms to the set delay time $T_{DP}'$ and inputs this signal to the subtractor SBR of the distortion compensation coefficient updater 82e.

The control unit CTU of the delay-time decision unit 81 thenceforth starts control for deciding delay time. In order to decide delay time, the usual practice is as follows: At a first step, the delay time is found by changing the time lag between the transmit signal and feedback signal successively at N-number of sampling time units. Thereafter, at a second step, the correlation between the feedback signal and a transmit signal in the vicinity of the delay discrepancy of greatest correlation obtained at the first step is found while changing the delay discrepancy successively at the sampling time unit, and the delay time is decided based upon the time lag for which the greatest correlation is obtained. However, in control for high-speed delay adjustment, the control unit CTU regards the delay time $T_{DP}'$ ($=T_{DS}+\Delta T$) as a delay discrepancy of greatest correlation obtained at the first step, skips processing for deciding delay time at N-number of sampling time units of the first step and immediately executes processing for deciding delay time at the sampling time unit of the second step. In other words, the control unit CTU adopts a narrow range centered on the delay time $T_{DP}'$, which has been set at step 1002, as the object of a search and calculates correlation while changing the delay discrepancy successively in increments of one sampling clock and decides the delay time $T_{DP}$ for which correlation is maximized (steps 1003, 1004).

If the delay time $T_{DP}$ for which correlation is greatest is found, the control unit CTU stores this delay time in the memory MEM and sets the delay time in the selector SL1 of the delay circuit 82*d* (step 1005). The selector SL1 extract the transmit signal from the shift position of the shift register SFR conforming to the set delay time $T_{DP}$ and inputs this transmit signal to the subtractor SBR of the distortion compensation coefficient updater 82*e*.

In accordance with the above-described control for high-speed delay adjustment, the precise delay time can be decided in a short time taking a narrow search range centered on the delay time $T_{DP}$', which has been set in the delay circuit, as the range of interest. Moreover, high-speed start-up taking several seconds or less is possible.

(D) Transmit-signal Processor of Second Embodiment

Figure 6:
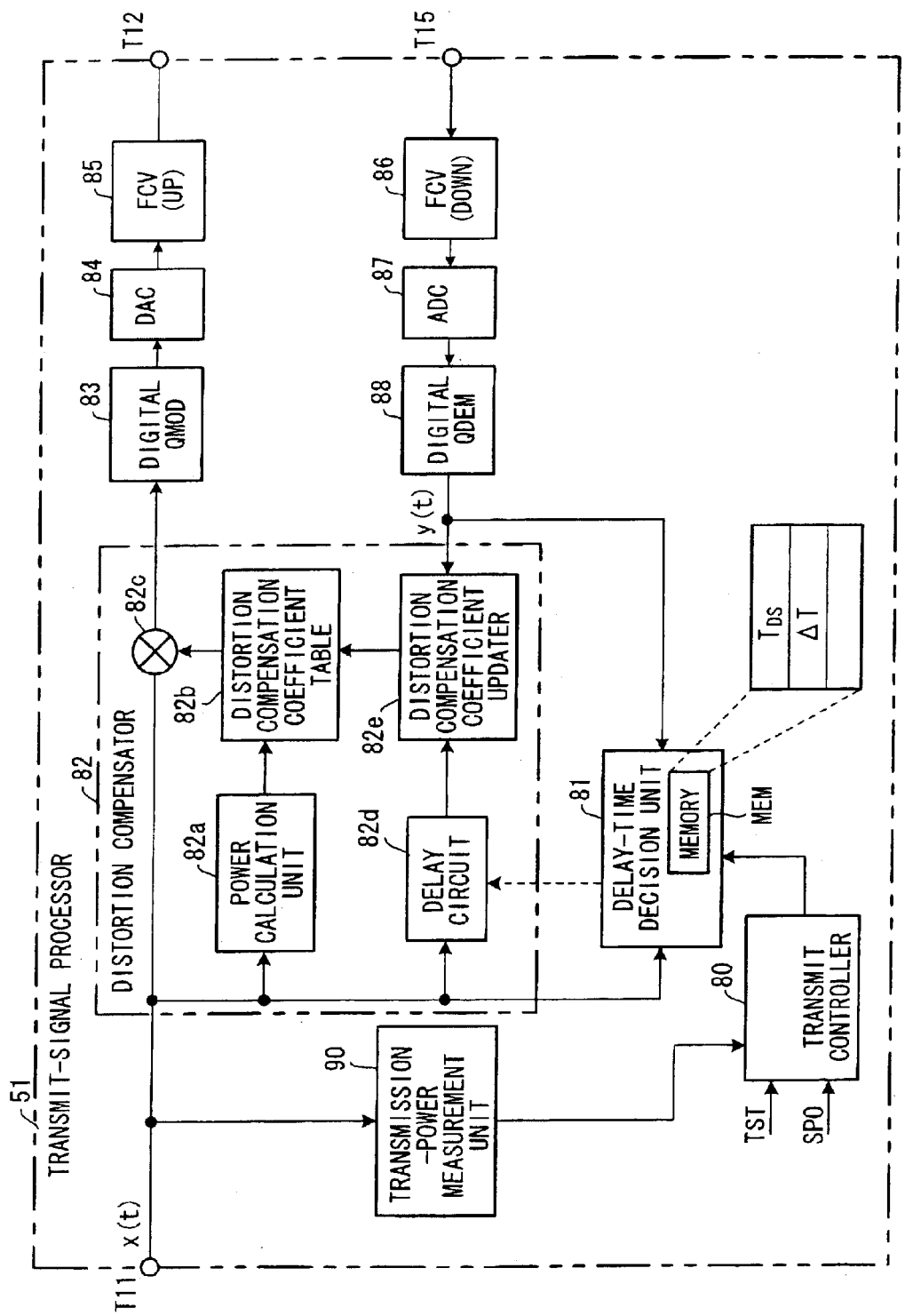
FIG. 6 is a block diagram showing a transmit-signal processor in a transmission amplifier according to a second embodiment of the present invention.

FIG. 6 is a block diagram showing the transmit-signal processor 51 in the transmission amplifier of a second embodiment. Components identical with those of the first embodiment of FIG. 3 are designated by like reference characters. This embodiment differs from the first embodiment in that a transmission-power measurement unit 90 is provided for measuring the power of the transmit signal, and in that the delay-time decision is rendered again based upon a difference between power before and power after the delay-time decision.

Figure 7:
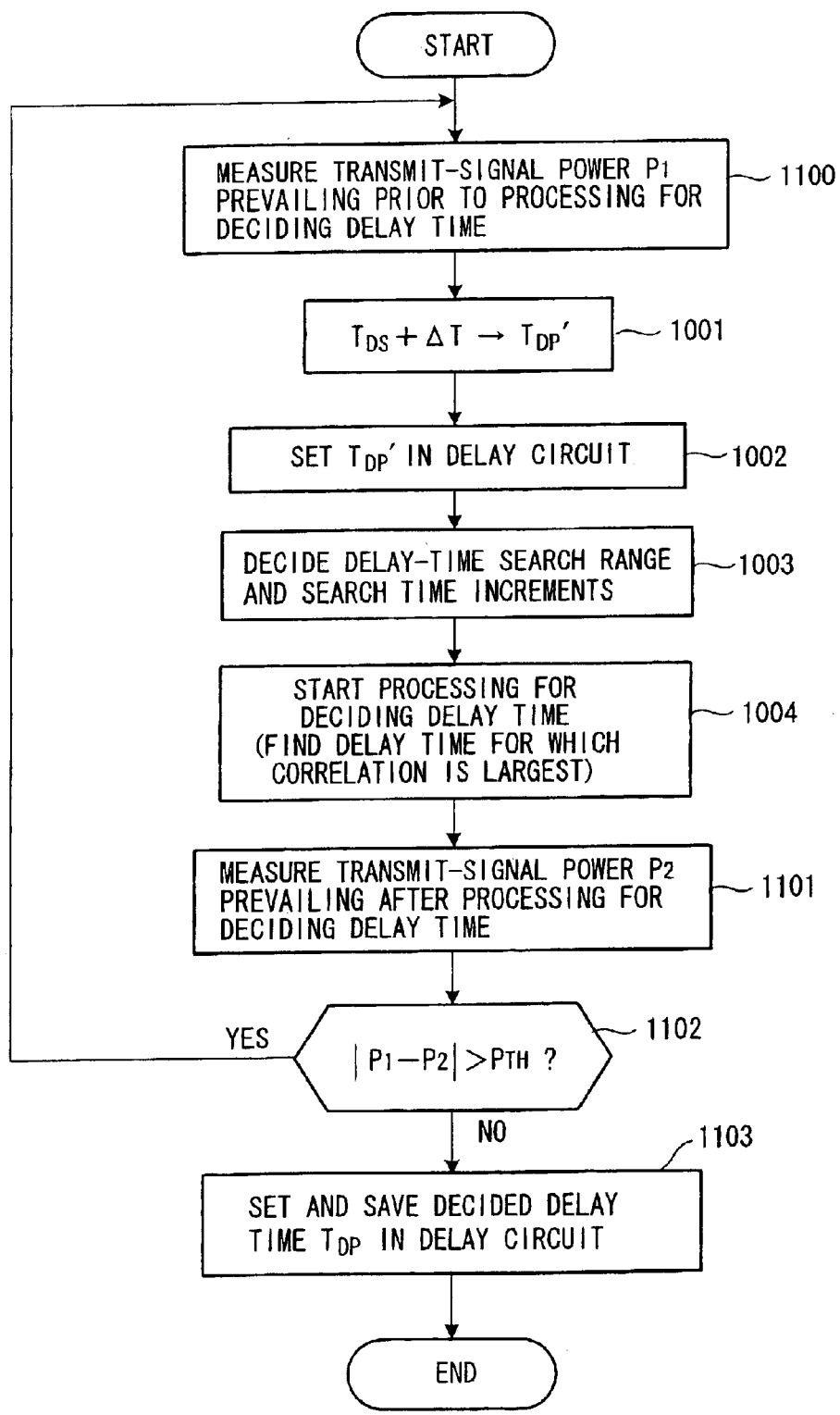
FIG. 7 is a flowchart illustrating processing for high-speed delay adjustment according to the second embodiment.

FIG. 7 is a flowchart illustrating processing of control for high-speed delay adjustment according to the second embodiment.

When the host apparatus issues the operation-type signal SPO indicative of parallel operation and the transmit-start signal TST, the transmit controller 80 instructs the delay-time decision unit 81 to set a delay time that conforms to the parallel operation. In addition, the transmit controller 80 acquires and stores transmit-signal power P1, which prevails prior to the delay-time decision, measured by the transmission-power measurement unit 90 (step 1100).

When the transmit controller 80 instructs the setting of a delay time conforming to parallel operation, the control unit CTU (see FIG. 4) of the delay-time decision unit 81 executes processing similar to that of steps 1001 to 1004 of FIG. 5 and decides the delay time $T_{DP}$ for which correlation is maximum.

When the processing for deciding the delay time $T_{DP}$ ends, the transmit controller 80 acquires transmit-signal power P2, which prevails after the delay-time decision, measured by the transmission-power measurement unit 90 (step 1101) and checks to determine whether the power fluctuation |P1–P2|, namely the difference between power before and power after the delay-time decision, is greater than a set value $P_{TH}$ (step 1102). If |P1–P2|>$P_{TH}$ holds, the delay time decided is regarded as not being accurate and control returns to step 1100, where the transmit controller 80 instructs the delay-time decision unit 81 to render the delay-time decision again. The reason for causing the delay-time decision unit 81 to decide delay time again is that the accuracy of delay time will decline if the transmission power varies during processing for deciding the delay time.

On the other hand, if |P1–P2|≦$P_{TH}$ is found to hold at step 1102, the transmit controller 80 instructs the delay-time decision unit 81 to set the decided delay time $T_{DP}$ in the delay circuit 82*d*. In response, the control unit CTU of the delay-time decision unit 81 stores the delay time $T_{DP}$ in the memory MEM and sets this delay time in the selector SL1 (FIG. 4) of the delay circuit 82*d* (step 1103). The selector SL1 extracts the transmit signal from the shift position of the shift register SFR conforming to the delay time $T_{DP}$ that has been set and inputs this transmit signal to the subtractor SBR of the distortion compensation coefficient updater 82*e*.

In the foregoing, control is such that whether the processing for deciding delay time is re-executed or not depends upon whether the difference in power is greater than a set value. However, it can be so arranged that whether the processing for deciding delay time is re-executed or not depends upon whether the power ratio is greater than a set value.

In accordance with the second embodiment, processing for deciding delay time is re-executed if a fluctuation in transmission power-greater than a set value occurs during processing for deciding delay time. As a result, delay time is decided in highly precise fashion and can be set in a delay circuit. This makes it possible to compensate for distortion in stable fashion.

(E) Transmit-signal Processor of Third Embodiment

Figure 8:
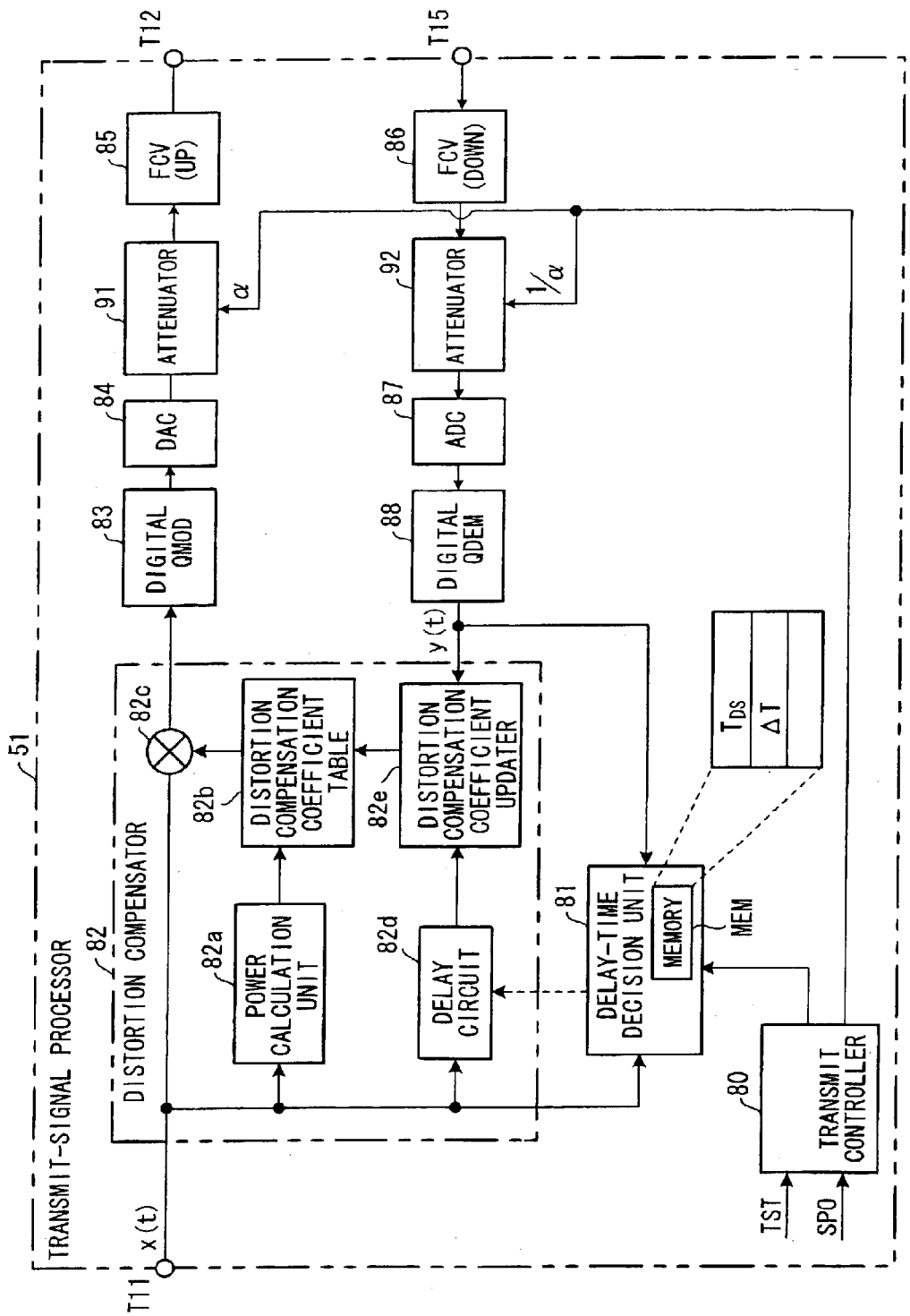
FIG. 8 is a block diagram showing a transmit-signal processor in a transmission amplifier according to a third embodiment of the present invention.

FIG. 8 is a block diagram showing the transmit-signal processor 51 in the transmission amplifier of a third embodiment. Components identical with those of the first embodiment of FIG. 3 are designated by like reference characters. This embodiment differs from the first embodiment in that an attenuator 91 is provided on the input side of the frequency converter 85 and an attenuator 92 is provided on the output side of the frequency converter 86. Since distortion compensation is not carried out during control for deciding delay time, distortion occurs and unnecessary waves are transmitted if the transmission power is greater than a fixed value. Accordingly, in order to prevent the occurrence of unnecessary waves, the third embodiment is such that the level of the transmit signal is attenuated to such an extent that the transmit signal will not be distorted and to such an extent that control for deciding delay time can be performed in accurate fashion.

Figure 9:
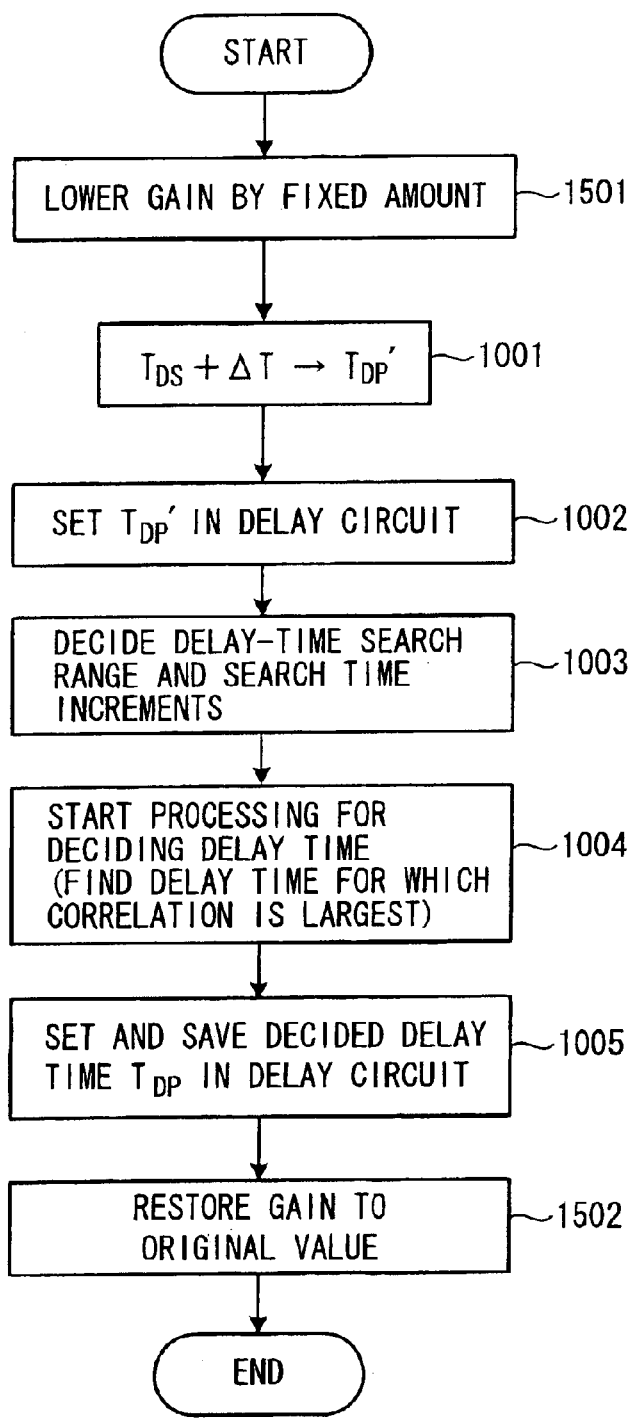
FIG. 9 is a flowchart illustrating processing for high-speed delay adjustment according to the third embodiment.
Figure 10:
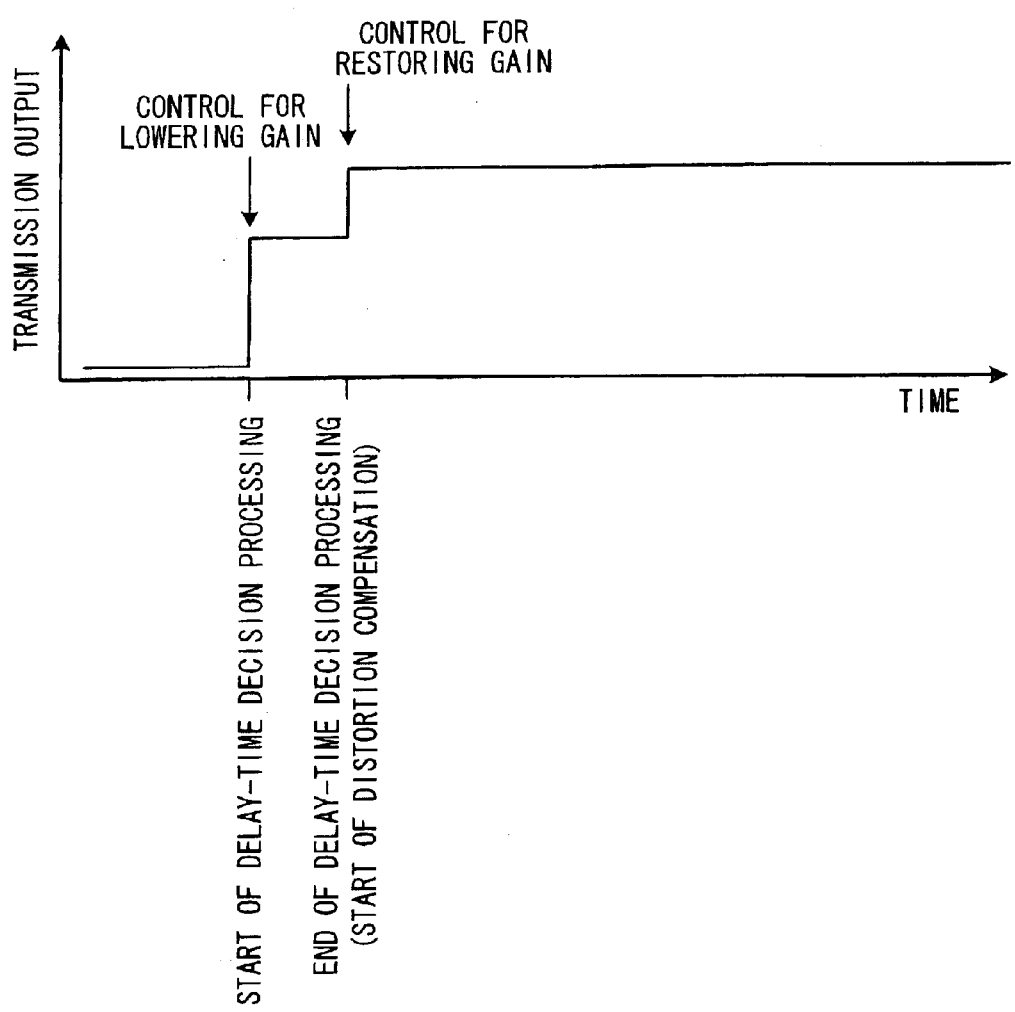
FIG. 10 is a diagram useful in describing gain control according to the third embodiment.

FIG. 9 is a flowchart illustrating processing of control for high-speed delay adjustment according to the third embodiment, and FIG. 10 is a diagram useful in describing gain control according to the third embodiment.

When the host apparatus issues the operation-type signal SPO indicative of parallel operation and the transmit-start signal TST, the transmit controller 80 instructs the delay-time decision unit 81 to set a delay time that conforms to the parallel operation. In addition, the transmit controller 80 sets a gain $\alpha$ ($\alpha$<1) in the attenuator 91. As a result, the transmit signal is attenuated to such an extent that the transmit signal will not be distorted and to such an extent that control for deciding delay time can be performed accurately. Further, the transmit controller 80 sets a gain of $1/\alpha$ in the attenuator 92 to enlarge the feedback signal by the amount of attenuation applied by the attenuator 91 (step 1501).

When the transmit controller 80 instructs the setting of a delay time conforming to parallel operation, the control unit CTU (see FIG. 4) of the delay-time decision unit 81 executes processing similar to that of steps 1001 to 1005 of the first embodiment shown in FIG. 5, decides the delay time $T_{DP}$ for which correlation is maximum, stores this delay time $T_{DP}$ in the memory MEM and sets it in the selector SL1 (FIG. 4) of the delay circuit 82*d* (steps 1001 to 1005). The selector SL1 extracts the transmit signal from the shift position of the shift register SFR conforming to the delay time $T_{DP}$ that has been set and inputs this transmit signal to the distortion compensation coefficient updater 82*e*.

Thereafter, the transmit controller 80 restores the gains of the attenuators 91, 92 to the original values (step 1502) and starts distortion compensation.

Thus, in accordance with the third embodiment, the transmission output is reduced to prevent the generation of unnecessary waves by performing control to lower gain at the start of processing for deciding delay time. Further, gain is restored at the end of processing for deciding delay time so that control for distortion compensation can be started.

In the foregoing, gain is controlled using attenuators. However, gain can also be controlled using a variable gain amplifier. This will hold true in the embodiments to follow.

(F) Transmit-signal Processor of Fourth Embodiment

Figure 11:
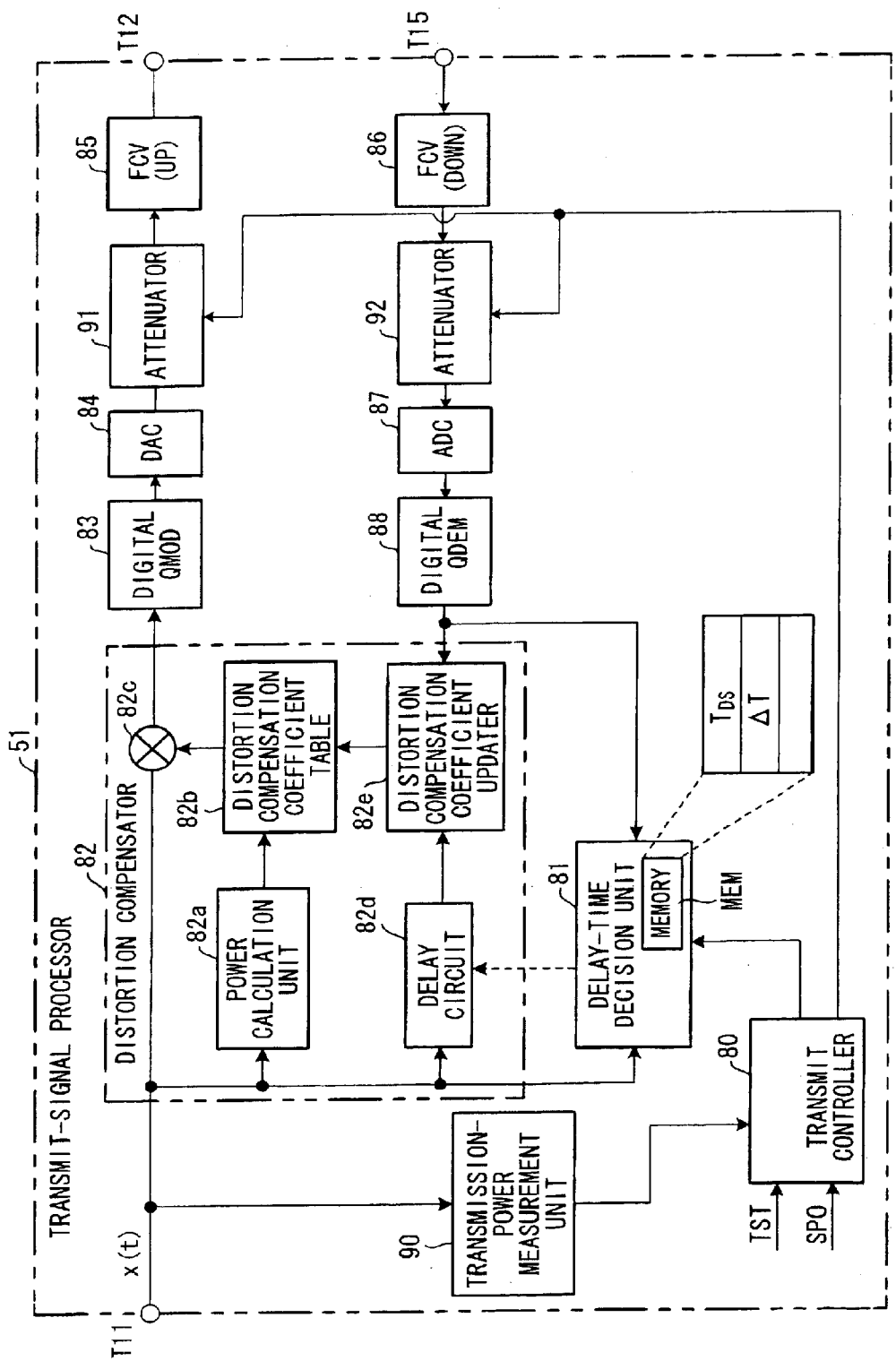
FIG. 11 is a block diagram showing a transmit-signal processor in a transmission amplifier according to a fourth embodiment of the present invention.
Figure 12:
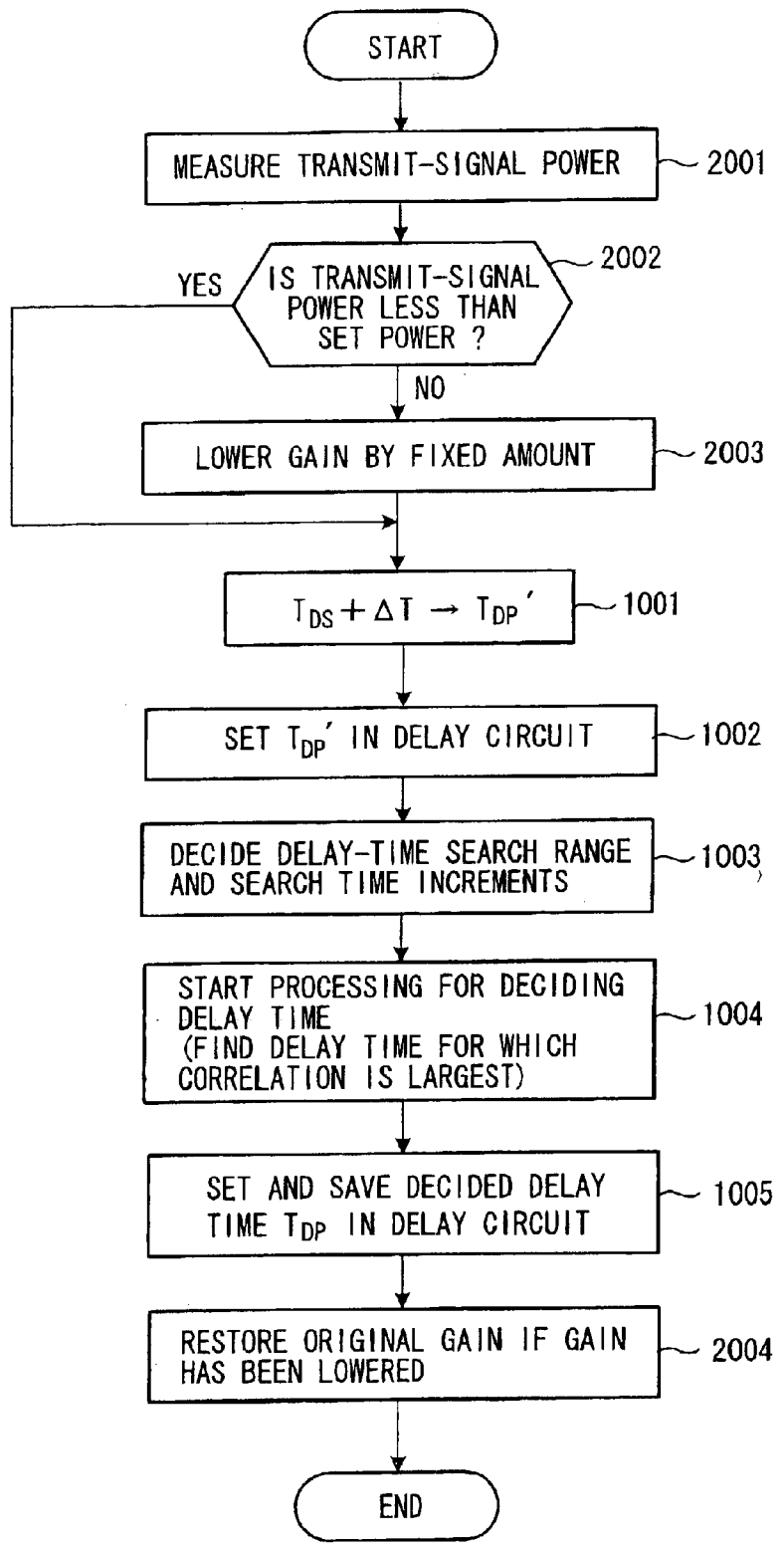
FIG. 12 is a flowchart illustrating processing for high-speed delay adjustment according to the fourth embodiment.

FIG. 11 is a block diagram showing the transmit-signal processor 51 in the transmission amplifier of a fourth embodiment. Components identical with those of the first embodiment of FIG. 3 are designated by like reference characters. This embodiment differs from the first embodiment in that ① the transmission-power measurement unit 90 is provided for measuring the power of the transmit signal, and ② the attenuator 91 is provided on the input side of the frequency converter 85 and the attenuator 92 is provided on the output side of the frequency converter 86.

Since distortion compensation is not carried out during control for deciding delay time, distortion occurs and unnecessary waves are transmitted if the transmission power is greater than a fixed value. Accordingly, in order to prevent the occurrence of unnecessary waves, the third embodiment is such that the level of the transmit signal is attenuated in such a manner that the transmit signal after amplification will not be distorted. However, if the transmit signal is attenuated indiscriminately, a small transmit signal will be made even smaller and control for deciding delay time will be impaired. In the fourth embodiment, control by attenuation is carried out only if the transmit signal is greater than a set level.

When the host apparatus issues the operation-type signal SPO indicative of parallel operation and the transmit-start signal TST, the transmit controller 80 acquires the transmit-signal power P1 measured by the transmission-power measurement unit 90 (step 2001). Next, the transmit controller 80 determines whether the transmit-signal power P1 is less than a set power (step 2002). If P1 is greater than the set value, the transmit controller 80 sets a gain $\alpha$ ($\alpha<1$) in the attenuator 91. As a result, the transmit signal is attenuated to such an extent that the transmit signal will not be distorted and to such an extent that control for deciding delay time can be performed accurately (step 2003). Further, the transmit controller 80 sets a gain of $1/\alpha$ in the attenuator 92 to enlarge the feedback signal by the amount of attenuation applied by the attenuator 91. It should be noted that if the transmit-signal power P1 is found to be less than the set power at step 2002, then gain control is not carried out.

The transmit controller 80 thenceforth instructs the delay-time decision unit 81 to set a delay time conforming to parallel operation. In response, the control unit CTU (see FIG. 4) of the delay-time decision unit 81 executes processing similar to that of steps 1001 to 1005 of the first embodiment shown in FIG. 5, decides the delay time $T_{DP}$ for which correlation is maximum, stores this delay time $T_{DP}$ in the memory MEM and sets it in the selector SL1 (FIG. 4) of the delay circuit 82d (steps 1001 to 1005). The selector SL1 extracts the transmit signal from the shift position of the shift register SFR conforming to the delay time $T_{DP}$ that has been set and inputs this transmit signal to the distortion compensation coefficient updater 82e.

Thereafter, if the transmit controller 80 has performed gain control at step 2003, the transmit controller 80 restores the gains of the attenuators 91, 92 to the original values (step 2004) and starts distortion compensation.

Figure 13:
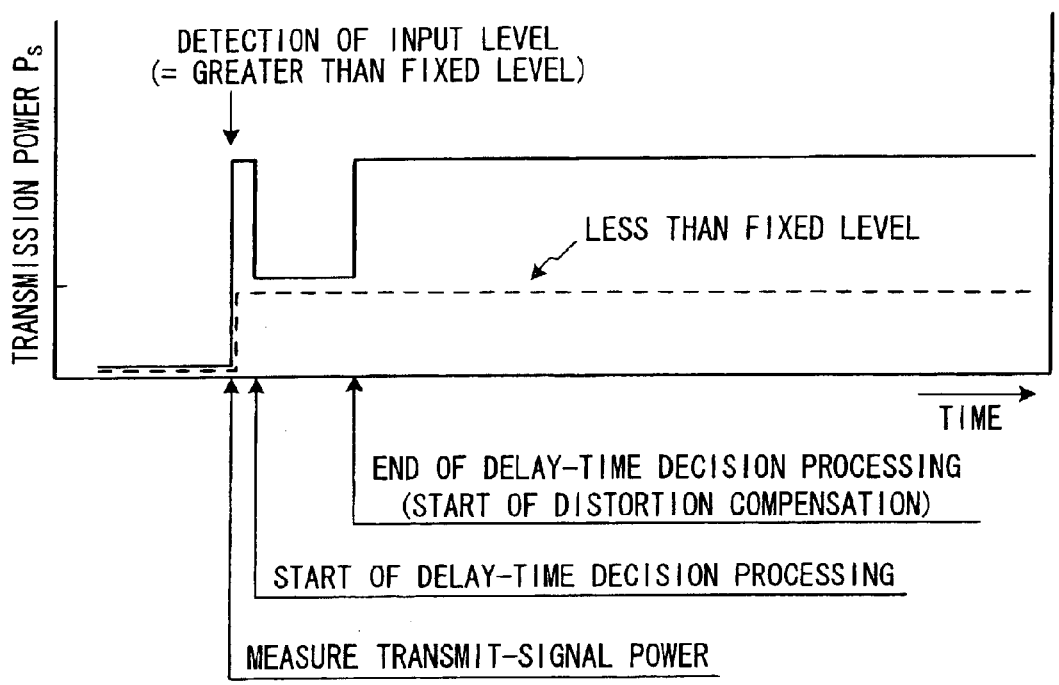
FIG. 13 is a diagram useful in describing gain control according to the fourth embodiment.

Thus, in accordance with the fourth embodiment, power is measured at the start of processing for deciding delay time, as indicated by the solid line in FIG. 13, the transmission output is reduced to prevent the generation of unnecessary waves by performing control to lower gain if power exceeds a set power Ps, and gain is restored at the end of processing for deciding delay time so that control for distortion compensation can be started. Further, as indicated by the dashed line, attenuation control is not applied if the power of the transmit signal is less than the set power, and therefore the transmit signal does not become too small and control for deciding delay time can be performed while preventing the occurrence of unnecessary waves.

First Modification

The fourth embodiment is such that if transmit-signal power is greater than the set power value Ps, the gain $\alpha$ ($\alpha<1$) is set in the attenuator 91 and the transmit signal is attenuated prior to amplification to such an extent that the transmit signal following amplification will not be distorted. The attenuating gain $\alpha$, however, is a constant. As a consequence, if the level of the transmit signal is too high, the signal cannot be attenuated down to an appropriate level. If the level of the transmit signal is too low, the level will remain below what is appropriate. Accordingly, in this modification, gain is controlled to obtain the appropriate gain irrespective of the level of the transmit signal.

Figure 14:
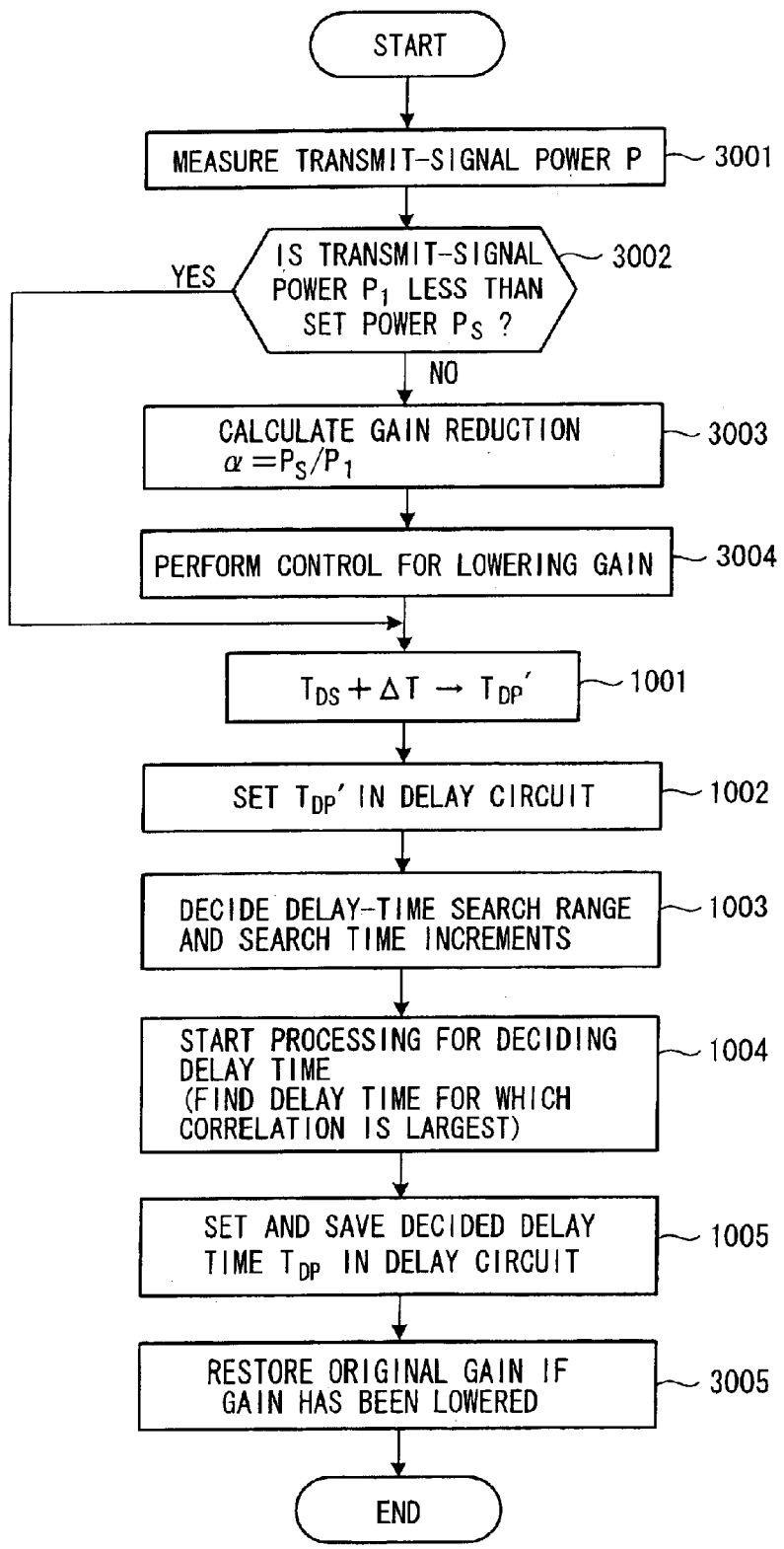
FIG. 14 is a flowchart illustrating processing for deciding delay time according to a first modification.
Figure 15:
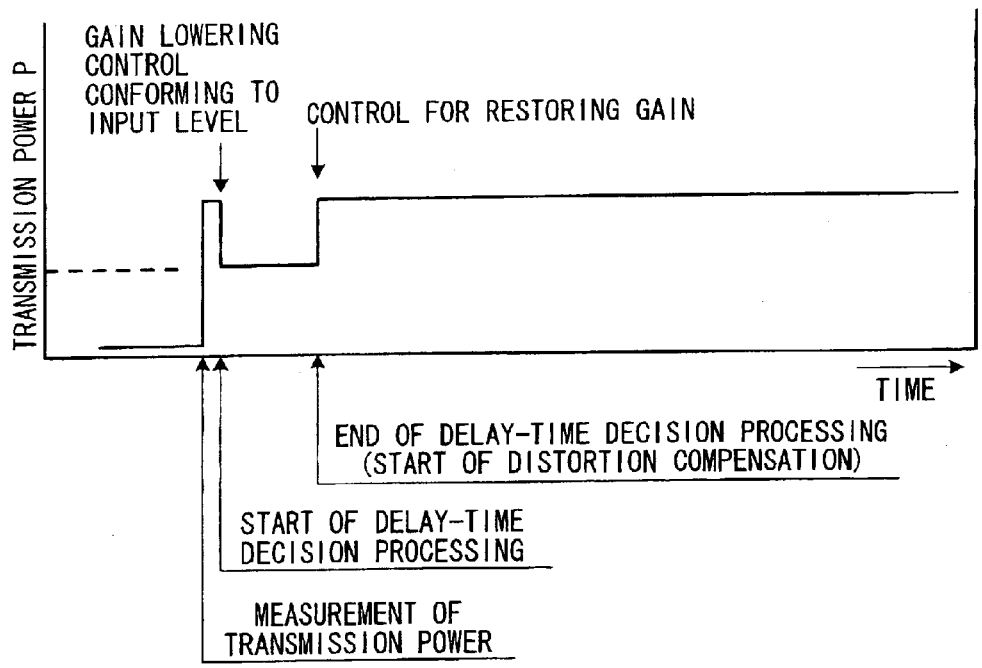
FIG. 15 is a diagram useful in describing gain control according to the first modification.

FIG. 14 is a flowchart illustrating processing for deciding delay time according to the first modification, and FIG. 15 is a diagram useful in describing gain control according to the first modification.

When the host apparatus issues the operation-type signal SPO indicative of parallel operation and the transmit-start signal TST, the transmit controller 80 acquires the transmit-signal power P1 measured by the transmission-power measurement unit 90 (step 3001). Next, the transmit controller 80 determines whether the transmit-signal power P1 is less than the set power Ps (step 3002). If P1 is greater than the set value (P1>Ps), the transmit controller 80 calculates gain $\alpha$ (step 3003) in accordance with the following equation:

$$\alpha = Ps/P1$$

and sets the gain $\alpha$ ($\alpha<1$) in the attenuator 91. As a result, the transmit signal is attenuated to such an extent that the transmit signal will not be distorted and to such an extent that control for deciding delay time can be performed accurately (step 3004). Further, the transmit controller 80 sets a gain of $1/\alpha$ in the attenuator 92 to enlarge the feedback signal by the amount of attenuation applied by the attenuator 91. It should be noted that if the transmit-signal power P1 is found to be less than the set power at step 3002, then gain control is not carried out.

The transmit controller 80 thenceforth instructs the delay-time decision unit 81 to set a delay time conforming to parallel operation. In response, the control unit CTU (see FIG. 4) of the delay-time decision unit 81 executes processing similar to that of steps 1001 to 1005 of the first embodiment shown in FIG. 5, decides the delay time $T_{DP}$ for which correlation is maximum, stores this delay time $T_{DP}$ in the memory MEM and sets it in the selector SL1 (FIG. 4) of the delay circuit 82d (steps 1001 to 1005). The selector SL1 extracts the transmit signal from the shift position of the shift register SFR conforming to the delay time $T_{DP}$ that has been set and inputs this transmit signal to the distortion compensation coefficient updater 82e.

Thereafter, if the transmit controller 80 has performed gain control at step 3004, the transmit controller 80 restores the gains of the attenuators 91, 92 to the original values (step 3005) and starts distortion compensation.

Thus, in accordance with the first modification, as shown in FIG. 15, power is measured at the start of processing for deciding delay time, gain is controlled variably based upon the power P1 if the power P1 exceeds the set power Ps, and control is exercised so as to obtain the set power Ps. As a result, the occurrence of unnecessary waves is prevented, thereby making it possible to contribute to maintenance of communication stability and quality of radio waves. Moreover, control for deciding delay time can be performed correctly.

Second Modification

In the fourth embodiment and first modification, gain is restored to the original value at a stroke simultaneous with the start of distortion compensation after delay time is decided. When power is restored all at once, however, the distortion compensation coefficients will not be at the correct values conforming to transmission power. As a consequence, control for distortion compensation cannot be performed stably and distortion is produced.

Figure 16:
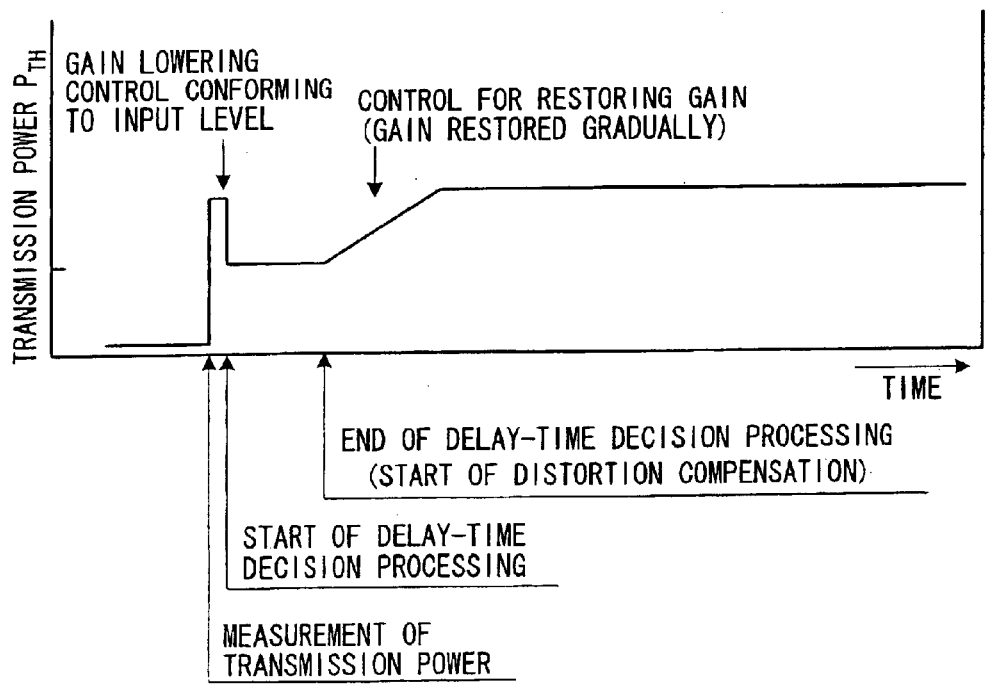
FIG. 16 is a diagram useful in describing gain control according to a second modification.

Accordingly, the second modification is such that at step 2004 in the fourth embodiment and step 3005 in the first modification, the transmit controller 80 restores gain to the original value gradually, as shown in FIG. 16, after the start of distortion compensation following the determination of delay time. If control for restoring gain is exercised in this fashion, gain can be restored to the original value while the occurrence of unnecessary waves is prevented.

(G) Transmit-signal Processor of Fifth Embodiment

Figure 17:
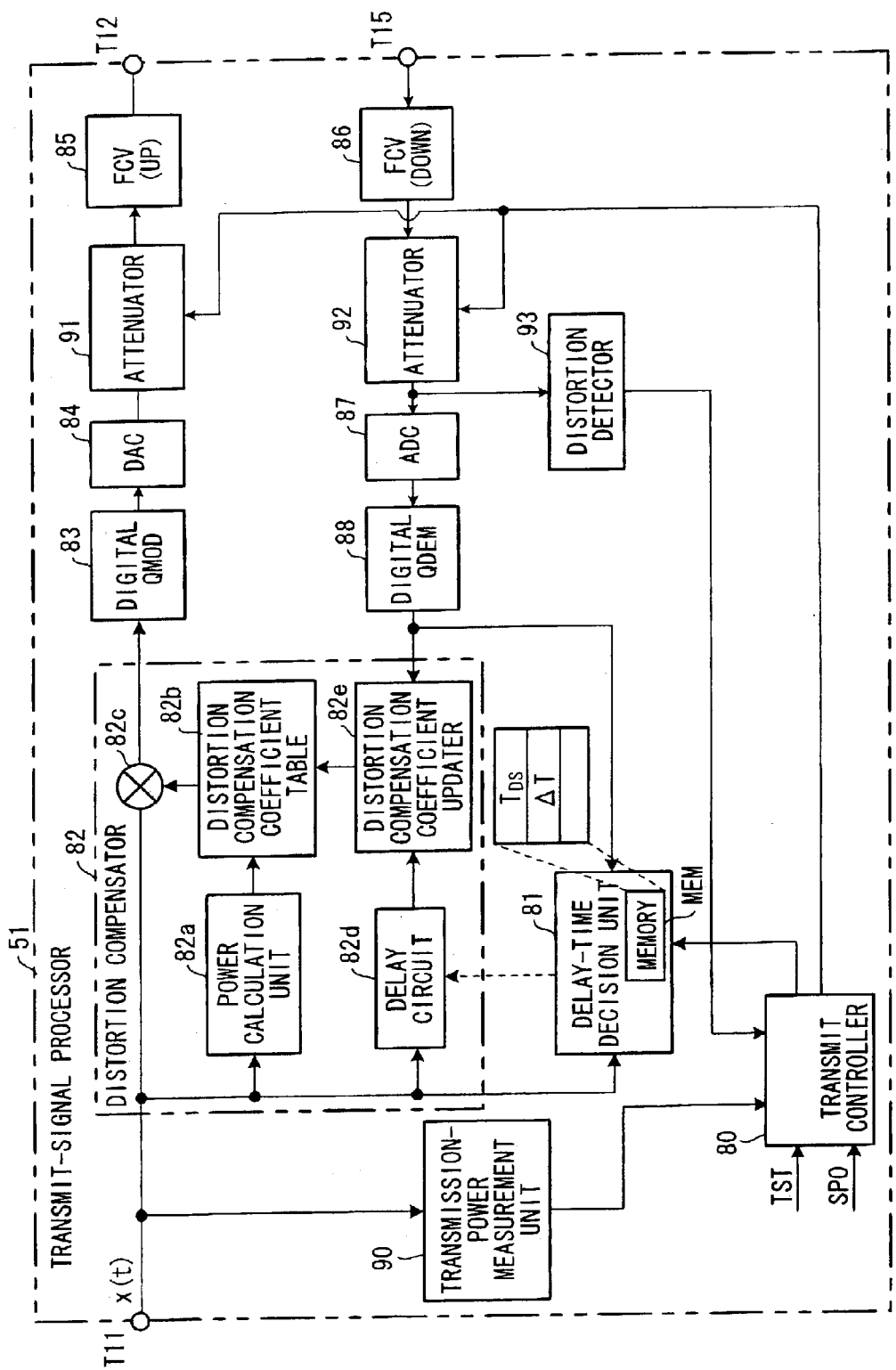
FIG. 17 is a block diagram showing a transmit-signal processor in a transmission amplifier according to a fifth embodiment of the present invention.
Figure 18:
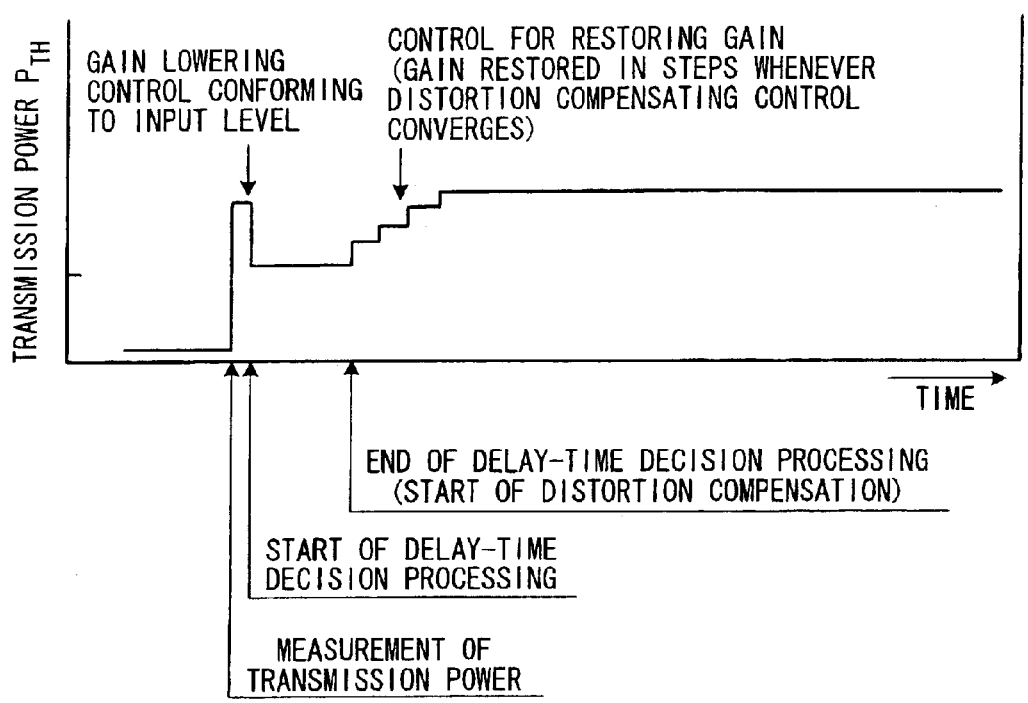
FIG. 18 is a diagram useful in describing gain control according to the fifth embodiment.

FIG. 17 is a block diagram showing the transmit-signal processor 51 in the transmission amplifier of a fifth embodiment, and FIG. 18 is a diagram useful in describing gain control according to the fifth embodiment. Components identical with those of the fourth embodiment of FIG. 11 are designated by like reference characters. This embodiment differs from the fourth embodiment in that ① a distortion detector 93 is provided, and ② when gain is restored to the original value, control for restoring gain to the original value is performed in small increments in stepwise fashion while detecting that distortion has fallen below a fixed value.

The distortion detector 93 detects ACPR (Adjacent Channel Power Ratio). If the ACPR is below the set value, the transmit controller 80 is capable of discriminating that distortion is small and that leakage power between adjacent channels is small. Accordingly, at step 2004 in the fourth embodiment and step 3005 in the first modification, the transmit controller 80 restores gain slightly whenever distortion becomes small after the start of distortion compensation following determination of delay time, then restores gain slightly again if it is detected that distortion has fallen below the fixed value owing to distortion compensating control. The transmit controller 80 repeats this operation until the original gain is finally restored in full.

In accordance with the fifth embodiment, gain is restored stepwise whenever distortion becomes small, as illustrated in FIG. 18. As a result, gain can be restored to the original value while the occurrence of unnecessary waves is prevented. This contributes to maintenance of radio-wave quality.

(H) Overall Control

Figure 19:
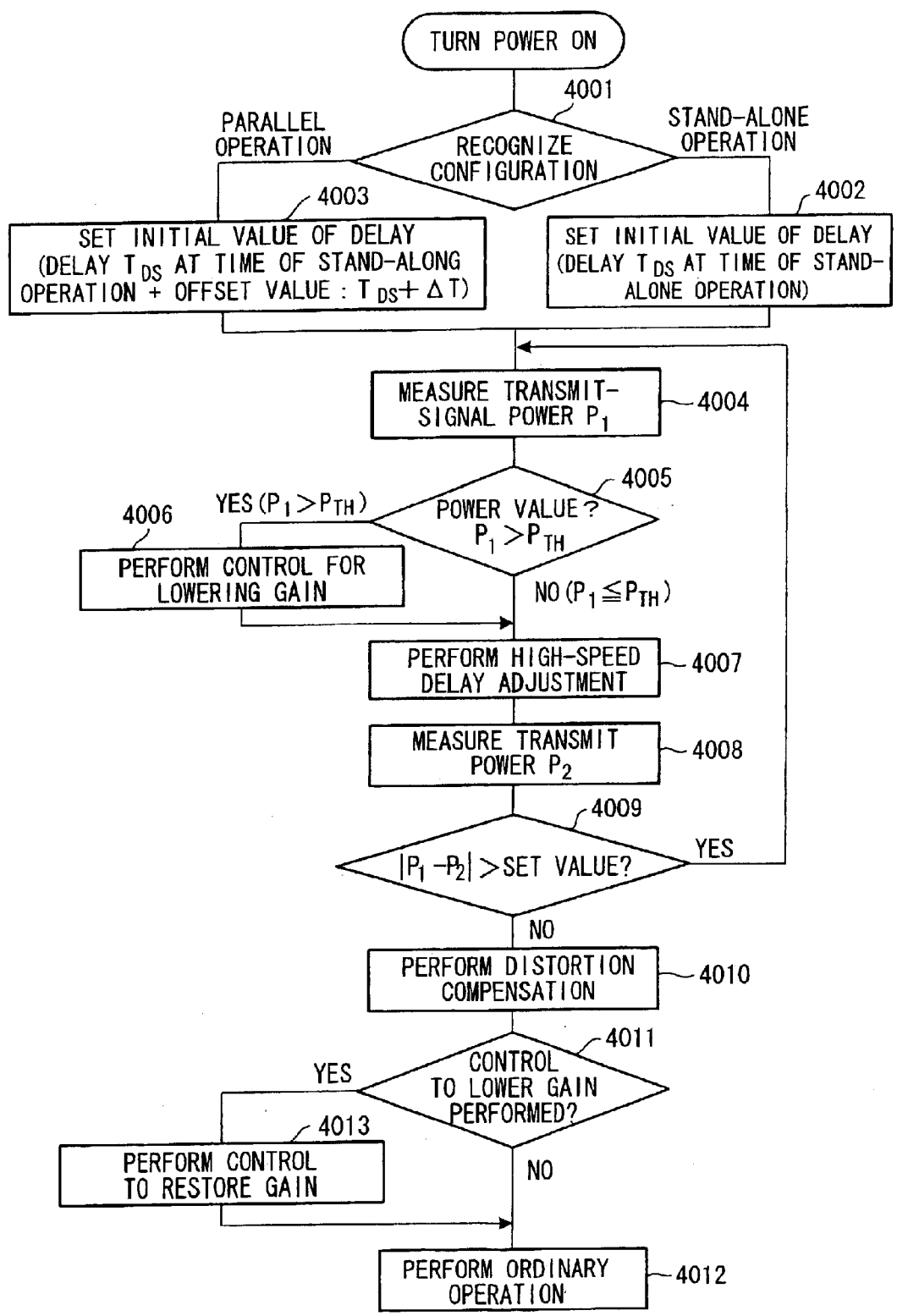
FIG. 19 is a flowchart illustrating overall control processing according to the present invention.
Figure 20:
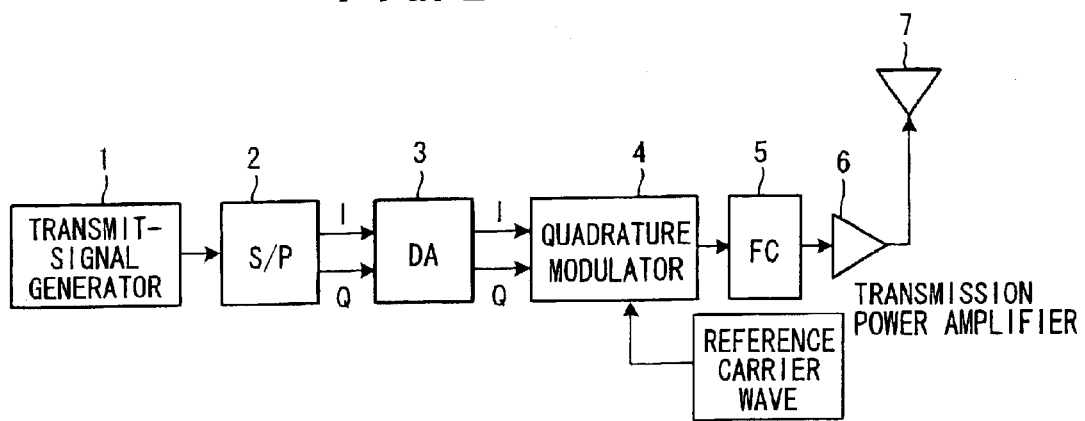
FIG. 20 is a block diagram showing an example of a transmitting apparatus in a radio according to the prior art.
Figure 21:
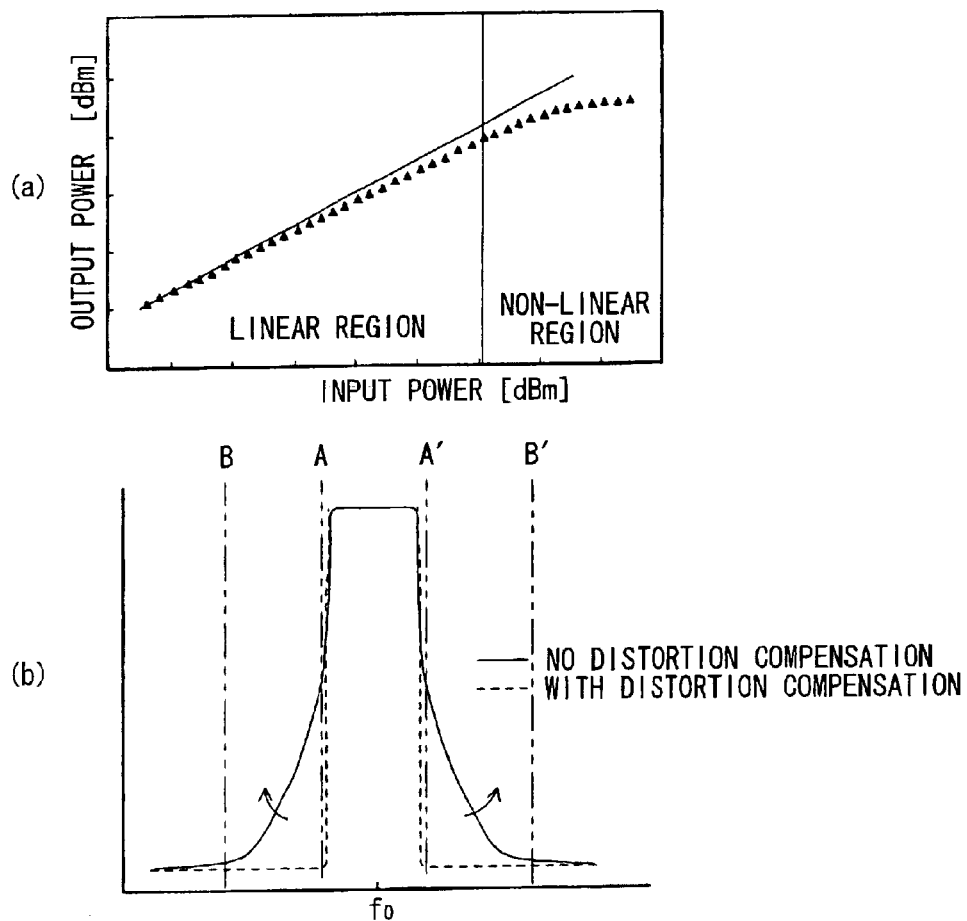
FIG. 21 is an input/output characteristic and frequency spectrum of a transmission amplifier according to the prior art.
Figure 22:
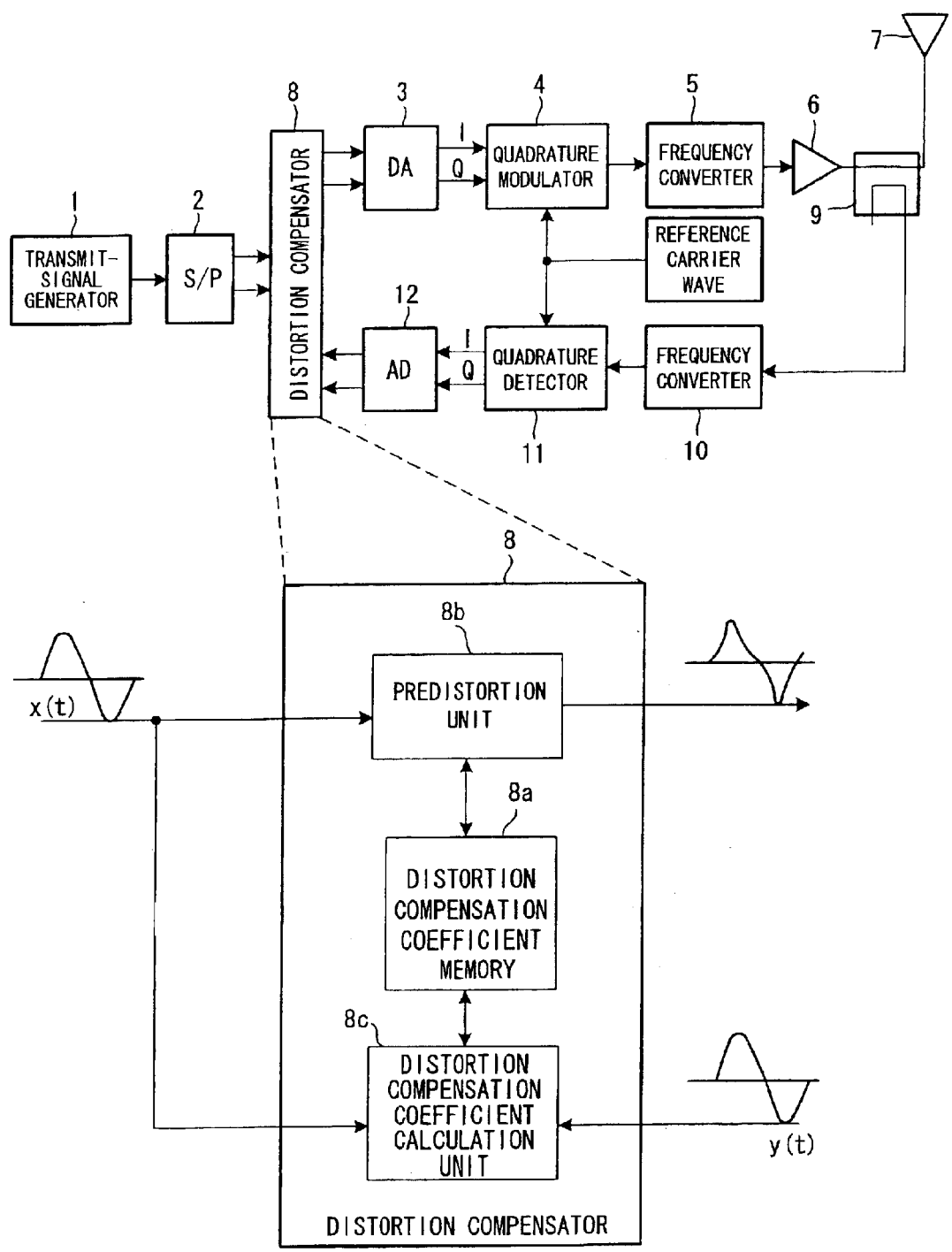
FIG. 22 is a block diagram of a transmitting apparatus equipped with a distortion compensating function according to the prior art.
Figure 23:
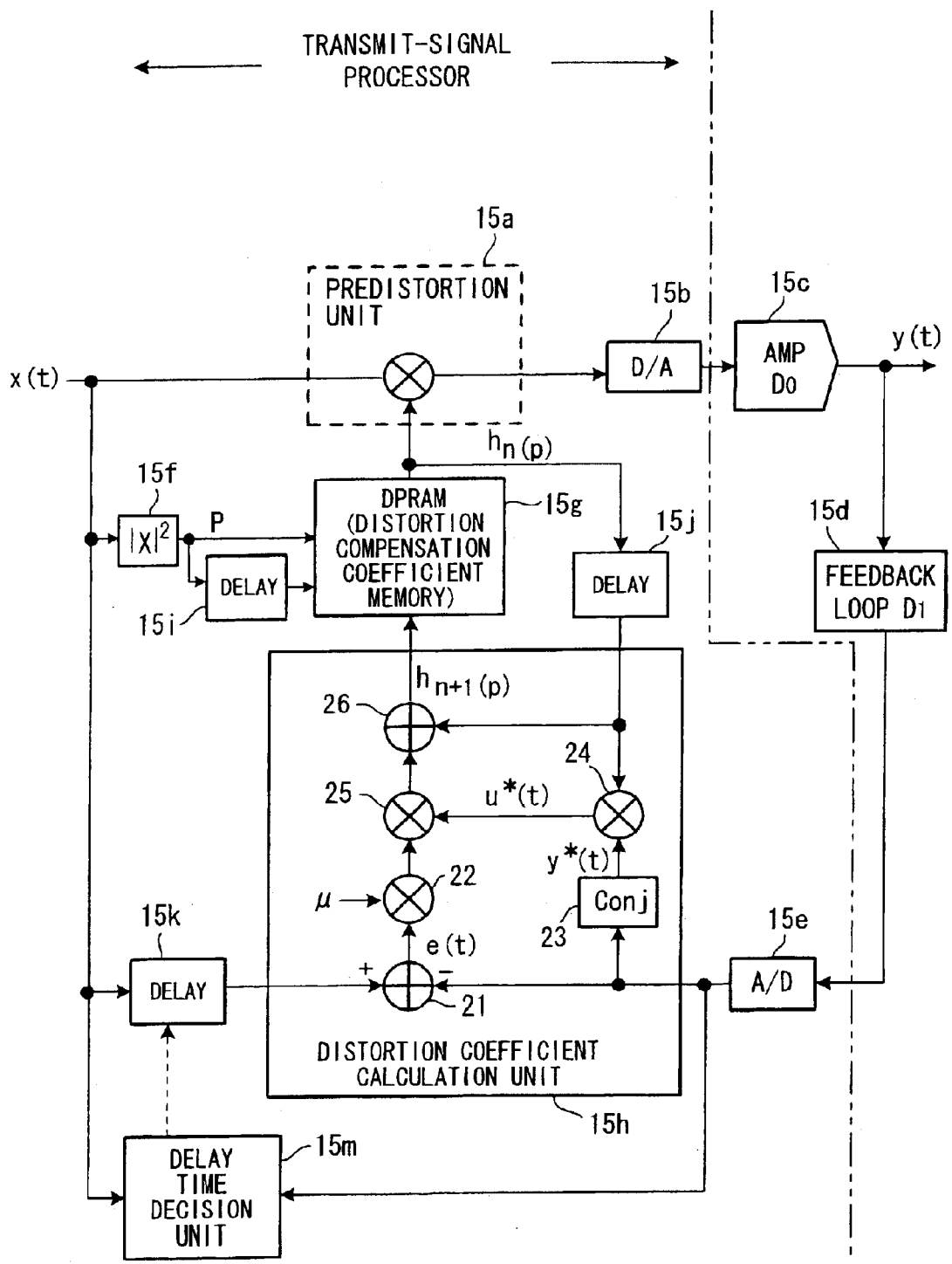
FIG. 23 is a diagram useful in describing distortion compensation processing according to adaptive LMS according to the prior art.
Figure 24:
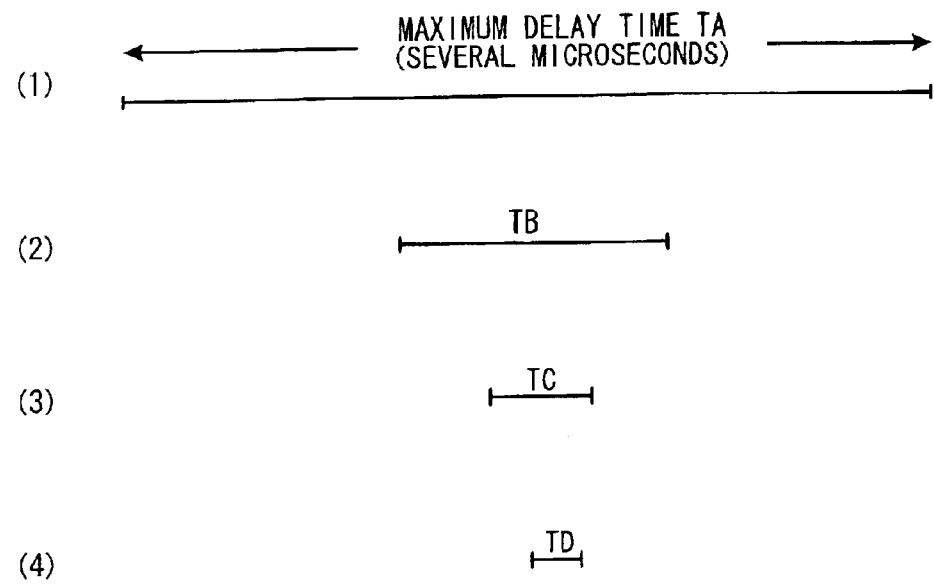
FIG. 24 is a diagram useful in describing processing for deciding delay time according to the prior art.
Figure 25:
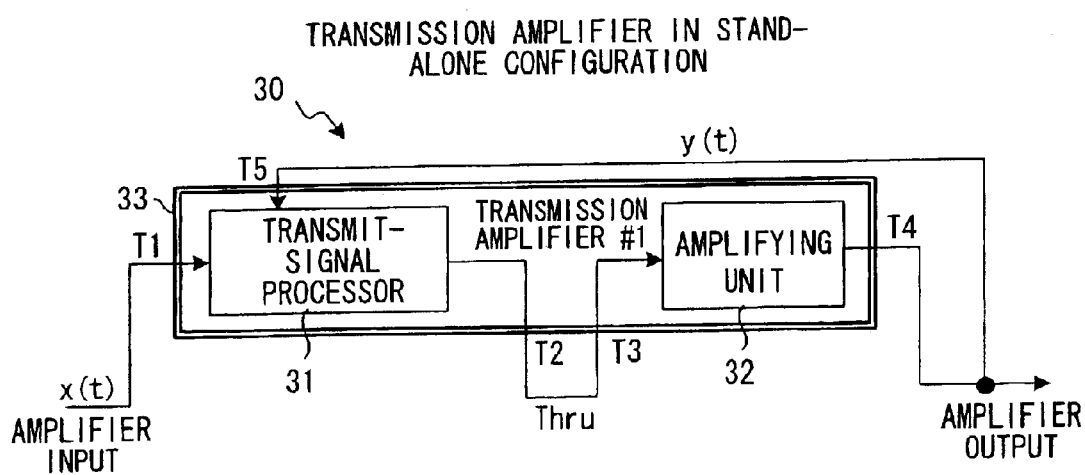
FIG. 25 is a diagram showing implementation of stand-alone operation of a transmission amplifier according to the prior art.
Figure 26:
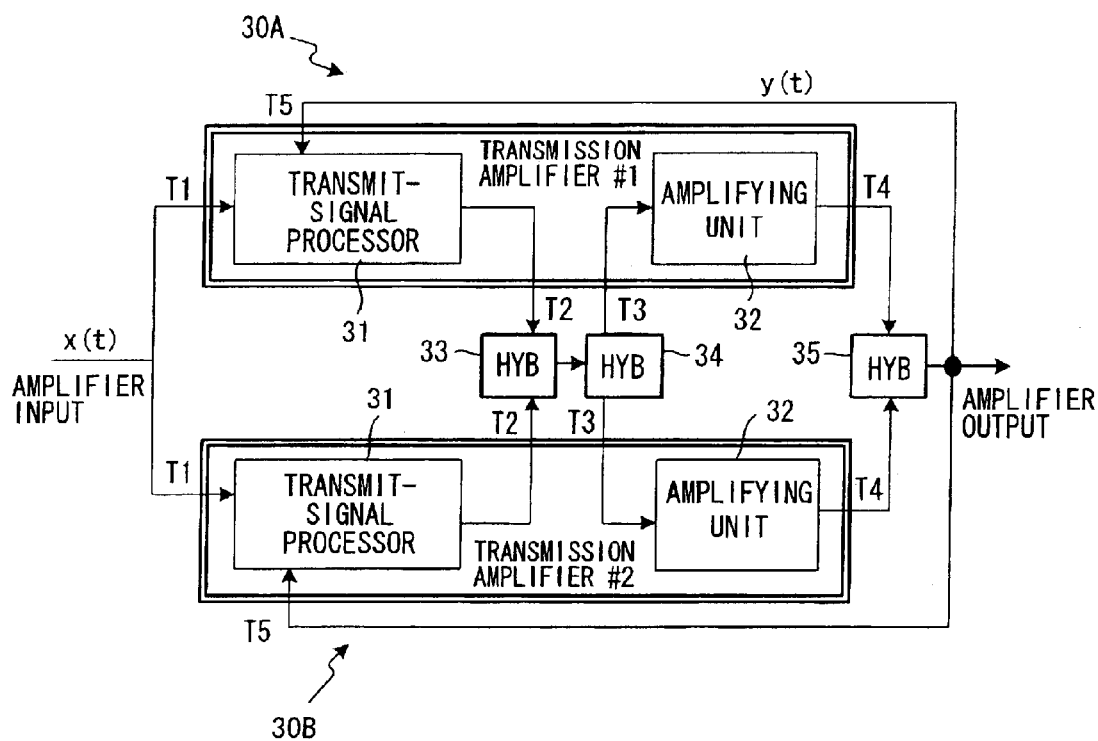
FIG. 26 is a diagram showing implementation of parallel operation of a transmission amplifier according to the prior art.

FIG. 19 is a flowchart illustrating overall control processing executed by the transmit-signal processor 51 (see FIG. 11) according to the present invention.

Based upon command data from the host, the transmit controller 80 determines whether the transmission amplifier is configured for stand-alone operation or parallel operation (step 4001). The delay-time decision unit 81 sets the feedback-signal delay time $T_{DS}$ for stand-alone operation in the delay circuit 82d (step 4002) if the transmission amplifier is configured for stand-alone operation, and sets the feedback-signal delay time $(T_{DS}+\Delta T)$ for parallel operation in the delay circuit 82d (step 4003) if the transmission amplifier is configured for parallel operation.

Next, the transmit-signal power P1 is measured (step 4004), it is determined whether the transmit-signal power P1 is greater than the set power value $P_{TH}$ (step 4005) and the gain of the transmit signal is lowered if P1 is greater than $P_{TH}$ (step 4006). Processing for high-speed delay adjustment is then executed (step 4007), transmit-signal power P2 is measured (step 4008) after delay time is decided, and it is determined whether the change |P1−P2| in power is greater than the set value (step 4009). If the answer is "YES", processing from step 4004 onward is executed to re-determine the delay time. On the other hand, if the change |P1−P2| in power is equal to or less than the set value ("NO" at step 4005), then control for distortion compensation is started (step 4010). Next, it is determined whether control for lowering gain was performed at step 4006 (step 4011). If control for lowering gain has not been executed, the gain is restored to the original value at a stroke, gradually or stepwise (step 4013) and then ordinary operation is started (step 4012).

In accordance with the present invention, the delay time $T_{DS}$ of the feedback signal at the time of stand-alone operation and the delay time difference $\Delta T$, which is the difference between delay times of the feedback signal at the time of stand-alone operation and at the time of parallel operation, or $(T_{DS}+\Delta T)$, are stored in advance. The delay time $T_{DS}$ is set in a delay circuit at the time of stand-alone operation, and $(T_{DS}+\Delta T)$ is stored in the delay circuit at the time of parallel operation. As a result, high-speed startup similar to that at the time of stand-alone operation becomes possible even at the time of parallel-operation start-up.

Further, in accordance with the present invention, accurate delay time is determined by focusing on a narrow search range centered on the delay time that has been set in the delay circuit. Even if adjustment of delay time is necessary, therefore, high-speed start-up becomes possible by determining delay time in a short time (several seconds or less).

Further, in accordance with the present invention, when transmission power before and transmission power after determination of delay time differs by more than a fixed value, delay time is re-determined. This makes it possible to prevent a decline in delay-time decision accuracy.

Further, in accordance with the present invention, when delay time is decided, a gain varying unit is controlled to lower the gain of the transmit signal. After delay time is decided, the gain of the transmit signal is restored to the original value. As a result, transmission of unnecessary waves at the time of the delay-time decision is prevented, thereby making it possible to contribute to maintenance of communication stability and quality of radio waves.

Further, in accordance with the present invention, after delay time is decided, lowered gain is restored to the original value gradually. As a result, distortion compensation can be performed stably and the normal state of communication can be restored rapidly while suppressing the transmission of unnecessary waves.

As many apparently widely different embodiments of the present invention can be made without departing from the spirit and scope thereof, it is to be understood that the invention is not limited to the specific embodiments thereof except as defined in the appended claims.

What is claimed is:

1. A transmission amplifier having a distortion compensator for compensating for distortion of an amplifier by updating distortion compensation coefficients so as to null a difference between a transmit signal and a feedback signal, and subjecting the transmit signal to distortion compensation processing using the distortion compensation coefficients; an amplifier for amplifying the transmit signal that has undergone distortion compensation; a feedback unit for feeding an output signal from the amplifier back to an arithmetic unit that calculates the difference in the distortion compensator; and a delay circuit for inputting the transmit signal to the arithmetic unit upon delaying the transmit signal for a delay time equivalent to time required for the feedback signal to arrive at the arithmetic unit, said transmission amplifier comprising:

- a storing unit for storing, in advance, a delay time $T_{DS}$ of the feedback signal at time of stand-alone operation of the transmission amplifier, and a delay time difference $\Delta T$, which is the difference between delay times of the feedback signal at time of stand-alone operation and at time of parallel operation of the transmission amplifier, or $(T_{DS}+\Delta T)$; and
- a delay-time setting unit for setting the delay time $T_{DS}$ in said delay circuit at the time of stand-alone operation and setting $(T_{DS}+\Delta T)$ in said delay circuit at the time of parallel operation.

2. The amplifier according to claim 1, further comprising a delay-time decision unit for adopting a narrow range in the vicinity of the set delay time as the object of a search and deciding an accurate delay time in said narrow range; wherein said delay-time setting unit sets the decided delay time in said delay circuit again.

3. The amplifier according to claim 2, further comprising:
- a power measurement unit for measuring transmit-signal power; and
- a controller for performing control so as to decide delay time again when transmission power before and transmission power after a delay-time decision differs by more than a fixed value.

4. The amplifier according to claim 2, further comprising:
- a gain varying unit for controlling gain of the transmit signal; and
- a controller for controlling said gain varying unit, when delay time is decided, to lower the gain of the transmit signal and then restore the original gain of the transmit signal after delay time is decided.

5. The amplifier according to claim 4, further comprising a power measurement unit for measuring transmit-signal power; wherein said controller forgoes control to lower gain when transmission power prevailing when the delay time is decided is less than a set value.

6. The amplifier according to claim 4, further comprising a power measurement unit for measuring transmit-signal power; wherein said controller decides amount of reduction in gain based upon transmission power prevailing when the delay time is decided.

7. The amplifier according to claim 4, wherein said controller restores lowered gain to original gain gradually after delay time is decided.

8. The amplifier according to claim 4, further comprising a detector for detecting that distortion compensating control has converged; wherein said controller repeatedly executes a process of starting distortion compensating control after the delay time is decided, restores gain a fixed amount when distortion compensating control has converged, and restores gain further when distortion compensating control has converged again, thereby finally restores the original gain in full.

* * * * *